(12) United States Patent
Yang et al.

(10) Patent No.: US 11,346,860 B2
(45) Date of Patent: *May 31, 2022

(54) PROBE HEAD FOR HIGH FREQUENCY SIGNAL TEST AND MEDIUM OR LOW FREQUENCY SIGNAL TEST AT THE SAME TIME

(71) Applicant: MPI CORPORATION, Chu-Pei (TW)

(72) Inventors: Chin-Tien Yang, Chu-Pei (TW);
Hui-Pin Yang, Chu-Pei (TW);
Shang-Jung Hsieh, Chu-Pei (TW);
Tsung-Yi Chen, Chu-Pei (TW);
Yu-Hao Chen, Chu-Pei (TW);
Jhin-Ying Lyu, Chu-Pei (TW)

(73) Assignee: MPI CORPORATION, Chu-Pei (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/990,612

(22) Filed: Aug. 11, 2020

(65) Prior Publication Data

US 2021/0048451 A1 Feb. 18, 2021

Related U.S. Application Data

(60) Provisional application No. 62/896,716, filed on Sep. 6, 2019, provisional application No. 62/887,232, filed on Aug. 15, 2019.

(30) Foreign Application Priority Data

| Oct. 25, 2019 | (TW) | 108138536 |
| Dec. 10, 2019 | (TW) | 108145118 |
| Jun. 15, 2020 | (TW) | 109120055 |

(51) Int. Cl.
*G01R 1/067* (2006.01)
*G01R 1/073* (2006.01)

(52) U.S. Cl.
CPC ..... *G01R 1/06722* (2013.01); *G01R 1/07378* (2013.01)

(58) Field of Classification Search
CPC .................................................. G01R 1/06722
See application file for complete search history.

(56) References Cited

U.S. PATENT DOCUMENTS 11,150,269 B2 * 10/2021 Yang .............. G01R 1/06772
2019/0361051 A1 * 11/2019 Vettori ............ G01R 1/07371

\* cited by examiner

*Primary Examiner* — Paresh Patel
(74) *Attorney, Agent, or Firm* — Birch, Stewart, Kolasch & Birch, LLP

(57) ABSTRACT

A probe head includes a probe seat having upper, middle and lower dies, an electrically conductive layer inside the probe seat, a first spring probe penetrating through the probe seat, and at least two shorter second spring probes penetrating through the lower die in a way that top ends of the second spring probes are located inside the probe seat and abutted against the electrically conductive layer. Another probe head includes the aforesaid probe seat, an electrically conductive layer partially inside the probe seat and partially outside the probe seat, a first spring probe penetrating through the probe seat, and a shorter second spring probe penetrating through the lower die in a way that a top end of the second spring probe is located inside the probe seat and abutted against the electrically conductive layer. As such, fine pitch requirement and different high frequency testing requirements are fulfilled.

17 Claims, 17 Drawing Sheets

PROBE HEAD FOR HIGH FREQUENCY SIGNAL TEST AND MEDIUM OR LOW FREQUENCY SIGNAL TEST AT THE SAME TIME

CROSS REFERENCE TO RELATED APPLICATIONS

This non-provisional application claims the benefit under 35 U.S.C. § 119(e) to U.S. Provisional Application No. 62/887,232, filed on Aug. 15, 2019; 62/896,716, filed on Sep. 6, 2019, and under 35 U.S.C. § 119(a) to Patent Application Nos. 108138536, filed in Taiwan on Oct. 25, 2019; 108145118, filed in Taiwan on Dec. 10, 2019; and 109120055, filed in Taiwan on Jun. 15, 2020, all of which are hereby expressly incorporated by reference into the present application.

BACKGROUND OF THE INVENTION

1. Field of the Invention

The present invention relates generally to probe heads of probe cards and more particularly, to a probe head for high frequency signal test and medium or low frequency signal test at the same time.

2. Description of the Related Art

Due to market demand, the packaging and testing of integrated circuits (also referred to as ICs) are developed towards fine pitch and high frequency. However, because of limitations of testing machines, cost considerations or probes that are too long in length to enable high frequency testing, current vertical probe cards (also referred to as VPCs) mainly perform loopback test by some of the probes in the probe card for high frequency testing. This means high frequency signal is sent and received respectively by a transmission contact (TX) and a reception contact (RX) of a device under test (also referred to as DUT) itself, i.e. the aforementioned IC, and the signal is tested by the DUT itself. In other words, the high frequency test signal is not produced by the testing machine and not transmitted to the testing machine. It should be noted that the signals mentioned in this specification may be digital signals or analog signals.

In the case that spring probes (also known as pogo pins) are adopted in the vertical probe card, in order to meet the requirements of fine pitch and high frequency testing, the spring probes, including those manufactured by forming, MEMS (microelectromechanical systems) and other ways, need to be configured as thin and short as possible, which means the spring probes should be small in outer diameter and short in length. However, considering electrical properties, mechanical properties, force, operating stroke, lifetime and so on, it is difficult to make the spring probe thin when it is short and it is difficult to make it short when it is thin. In other words, the requirements of fine pitch and high frequency testing are difficult to be satisfied at the same time by a same spring probe.

The conventional probe card that can be used for high frequency signal test and medium or low frequency signal test is primarily provided with a switch circuit to enable a same set of probes to be switched between an electrical conduction manner for high frequency loopback test and another electrical conduction manner for transmitting medium or low frequency test signal from the testing machine. Such probe card is relatively more complicated in circuit design, and the probes should be sized to meet the requirement of high frequency testing, thereby difficult to meet the requirement of fine pitch. Besides, considering the IC design, the pitch between the contacts, i.e. the distance between the contacts' centers, for high frequency signals is usually larger than the pitch between the contacts for other signals. Therefore, even with the aforementioned switch circuit, it is still difficult to apply the same probe to high frequency testing and medium or low frequency testing. Furthermore, in the conventional testing mode, the high frequency signal test is performed in the manner of loopback test only. Such testing mode may not satisfy the testing requirement and thereby still needs improvement.

SUMMARY OF THE INVENTION

The present invention has been accomplished in view of the above-noted circumstances. It is an objective of the present invention to provide a probe head which is adapted for high frequency signal test and medium or low frequency signal test at the same time, preventing probe cards from too complicated circuit design and meeting the requirements of fine pitch and high frequency testing at the same time.

To attain the above objective, the present invention provides a probe head for transmitting a first test signal and a second test signal higher in frequency than the first test signal. The probe head includes a probe seat, an electrically conductive layer, a first spring probe and at least two second spring probes. The probe seat includes an upper die, a middle die and a lower die. Each of the upper die, the middle die and the lower die has a top surface and a bottom surface, which face toward opposite directions. The middle die is disposed between the bottom surface of the upper die and the top surface of the lower die. The electrically conductive layer is disposed on one of the upper die, the middle die and the lower die and located inside the probe seat. The first spring probe penetrates through the upper die, the middle die and the lower die for transmitting the first test signal. The second spring probes penetrate through the lower die for transmitting the second test signal. Each of the second spring probes is shorter than the first spring probe and has a top end located inside the probe seat. Two second spring probes are electrically connected with each other in a way that the top ends thereof are abutted against the electrically conductive layer. Besides, the lower die has at least one lower installation hole unit penetrating through the top surface and the bottom surface of the lower die. The lower installation hole unit includes at least two lower installation holes and a communicating space communicating with the at least two lower installation holes. Each of the lower installation holes accommodates a second spring probe. Each of the second spring probes is partially located in the communicating space of the lower installation hole unit. For example, the lower installation hole unit may include a recess, and the lower installation holes of the lower installation hole unit penetrate through a bottom surface of the recess and the bottom surface of the lower die. Alternatively, each of the lower installation holes may include an upper section and a lower section, and the communicating space is located between the upper section and the lower section of each of the lower installation holes, so that the upper section extends downwardly from the top surface of the lower die to the communicating space and the lower section extends upwardly from the bottom surface of the lower die to the communicating space.

In other words, the second spring probes may, but not limited to, penetrate into the middle die and the upper die, but should be shorter in length than the first spring probe. Therefore, the top ends of the second spring probes and the electrically conductive layer should be all located inside the probe seat. This means the probe head of the present invention is provided with the relatively longer first spring probe penetrating through the whole probe seat, the relatively shorter second spring probes not penetrating through the whole probe seat (at least not penetrating through the top surface of the upper die), and the electrically conductive layer located inside the probe seat and electrically connected with two second spring probes. As a result, the at least two second spring probes are adapted for probing the high frequency signal transmission contact (TX) and reception contact (RX) of the DUT for high frequency signal loopback test. For example, the electrically conductive layer may include a conducting area for being abutted by the two second spring probes, and the two second spring probes is a set of transmission and reception probes for probing the transmission and reception contacts of the DUT, respectively. Alternatively, the electrically conductive layer may include two conducting areas for being abutted by two sets of transmission and reception probes, i.e. four second spring probes. The two conducting areas are electrically insulated from each other. Two second spring probes disposed in each conducting area are adapted for probing the transmission and reception contacts of the DUT respectively, and the second spring probes disposed in the two conducting areas are arranged as a differential probe set for differential signaling. This means each of the two conducting areas and the two second spring probes corresponding thereto form a signal transmitting path, and the two signal transmitting paths are adapted for transmitting differential signals opposite in phase. Besides, the first spring probe is adapted for probing other contacts of the DUT, such as ground contact, power contact and general medium or low frequency signal contacts. In this way, the second spring probes can be manufactured to be relatively shorter and thicker to satisfy the requirements for the electrical properties of high frequency testing, and the first spring probe can be manufactured to be relatively longer and thinner to meet the requirement of fine pitch in the condition with a plurality of first spring probes, so that the testing requirements of the whole IC are met. In addition, the above-mentioned recess or communicating space of the lower installation hole unit of the lower die communicates with at least two lower installation holes, so that at least two second spring probes are partially located in the same recess or communicating space of the lower installation hole unit. Such feature benefits the matching of capacitance and inductance, thereby enhancing the performance of the probe card. Especially in the aforementioned case that four second spring probes are arranged as a differential probe set for transmitting differential signals, locating two second spring probes, which are not electrically connected with each other in the same recess or communicating space of the lower installation hole unit, benefits the matching of capacitance and inductance better.

It is another objective of the present invention to provide a probe head which is adapted for high frequency signal test and medium or low frequency signal test at the same time, preventing probe cards from too complicated circuit design, meeting the requirements of fine pitch and high frequency testing at the same time, and being able to perform high frequency signal test through a testing machine.

To attain the above objective, the present invention provides a probe head which includes a probe seat, an electrically conductive layer, a first spring probe and a second spring probe. The probe seat includes an upper die, a middle die and a lower die. Each of the upper die, the middle die and the lower die has a top surface and a bottom surface, which face toward opposite directions. The middle die is disposed between the bottom surface of the upper die and the top surface of the lower die. The electrically conductive layer is disposed on one of the upper die, the middle die and the lower die. A part of the electrically conductive layer is located inside the probe seat. Another part of the electrically conductive layer extends to the outside of the probe seat. The first spring probe penetrates through the upper die, the middle die and the lower die. The second spring probe penetrates through the lower die. The second spring probe is shorter than the first spring probe and has a top end located inside the probe seat. The second spring probe is electrically connected with the electrically conductive layer in a way that the top end of the second spring probe is abutted against the electrically conductive layer.

In other words, this probe head is similar to the above-described probe head, but they are primarily different in that the electrically conductive layer of this probe head partially extends to the outside of the probe seat. Besides, this probe head is not used in loopback test, thereby unlimited to have at least two second spring probes. As a result, the electrically conductive layer of this probe head can be connected to a main circuit board of the probe card, so that the second spring probe can be electrically connected with a testing machine through the electrically conductive layer and the main circuit board. Alternatively, the electrically conductive layer may be directly connected to the testing machine, so that the second spring probe can be electrically connected with the testing machine through the electrically conductive layer. In this way, the second spring probe and the electrically conductive layer can transmit high frequency signal between a DUT and the testing machine for performing high frequency signal test through the testing machine instead of high frequency signal loopback test. Therefore, this probe head can satisfy the high frequency testing requirement differing from that the above-described probe head can satisfy.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
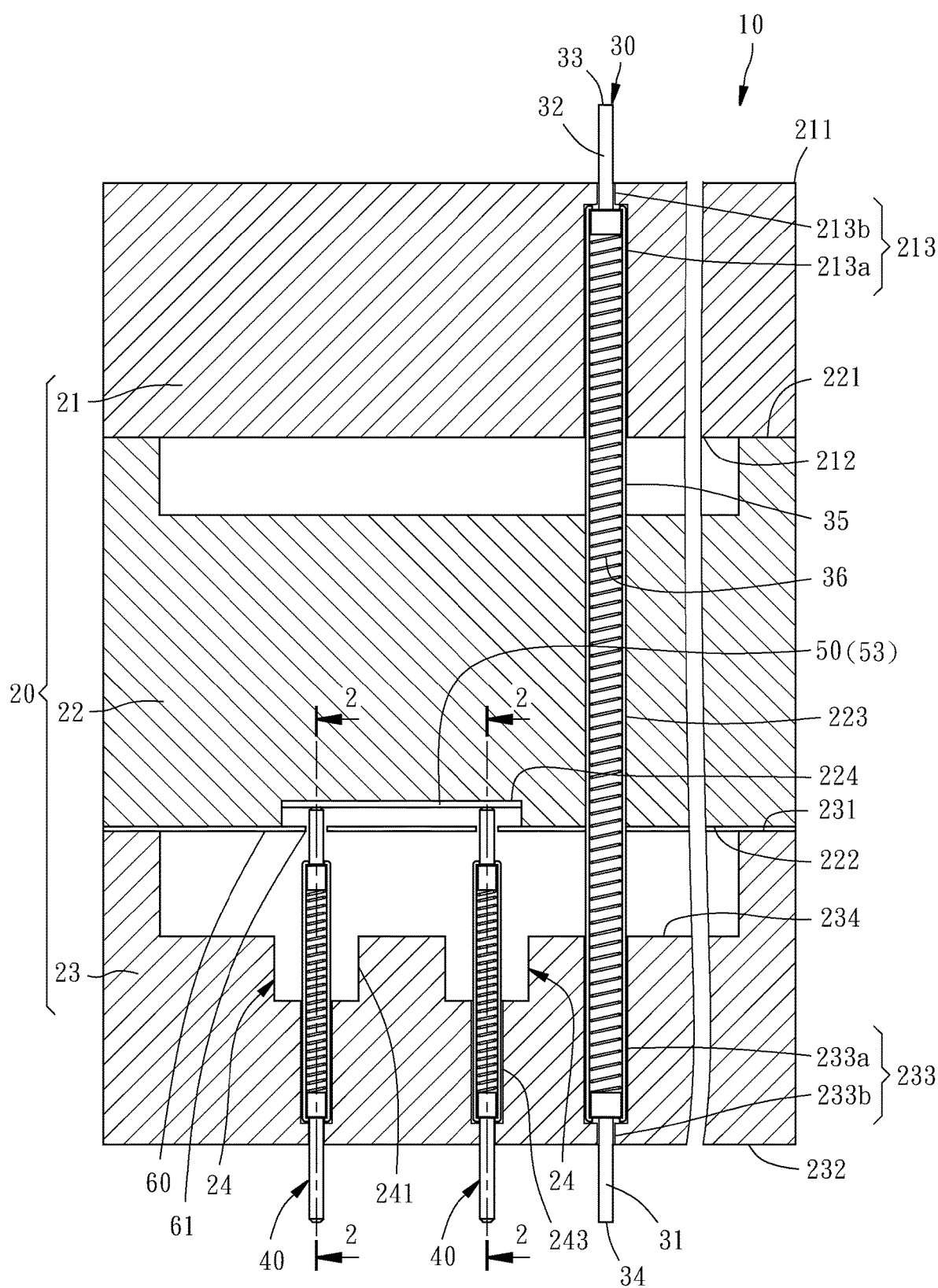
FIG. 1 is a schematic sectional view of a probe head for high frequency signal test and medium or low frequency signal test at the same time according to a first preferred embodiment of the present invention.

First of all, it is to be mentioned that same reference numerals used in the following embodiments and the appendix drawings designate same or similar elements or the structural features thereof throughout the specification for the purpose of concise illustration of the present invention. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between the two elements. It should be noticed that for the convenience of illustration, the components and the structure shown in the figures are not drawn according to the real scale and amount, and the features mentioned in each embodiment can be applied in the other embodiments if the application is possible in practice. In addition, the terms 'high frequency' and 'medium or low frequency' mentioned hereinafter are defined in a way that the transmission velocity of 'high frequency' signal is higher than the transmission velocity of 'medium or low frequency' signal. For example, if the transmission velocity of 'high frequency' signal is higher than or equal to 40 Gbps, the transmission velocity of 'medium or low frequency' signal is lower than 40 Gbps. But the present invention is unlimited to the aforementioned numerical value, which means the transmission velocity of 'high frequency' signal is unlimited to be higher than or equal to 40 Gbps.

Figure 2:
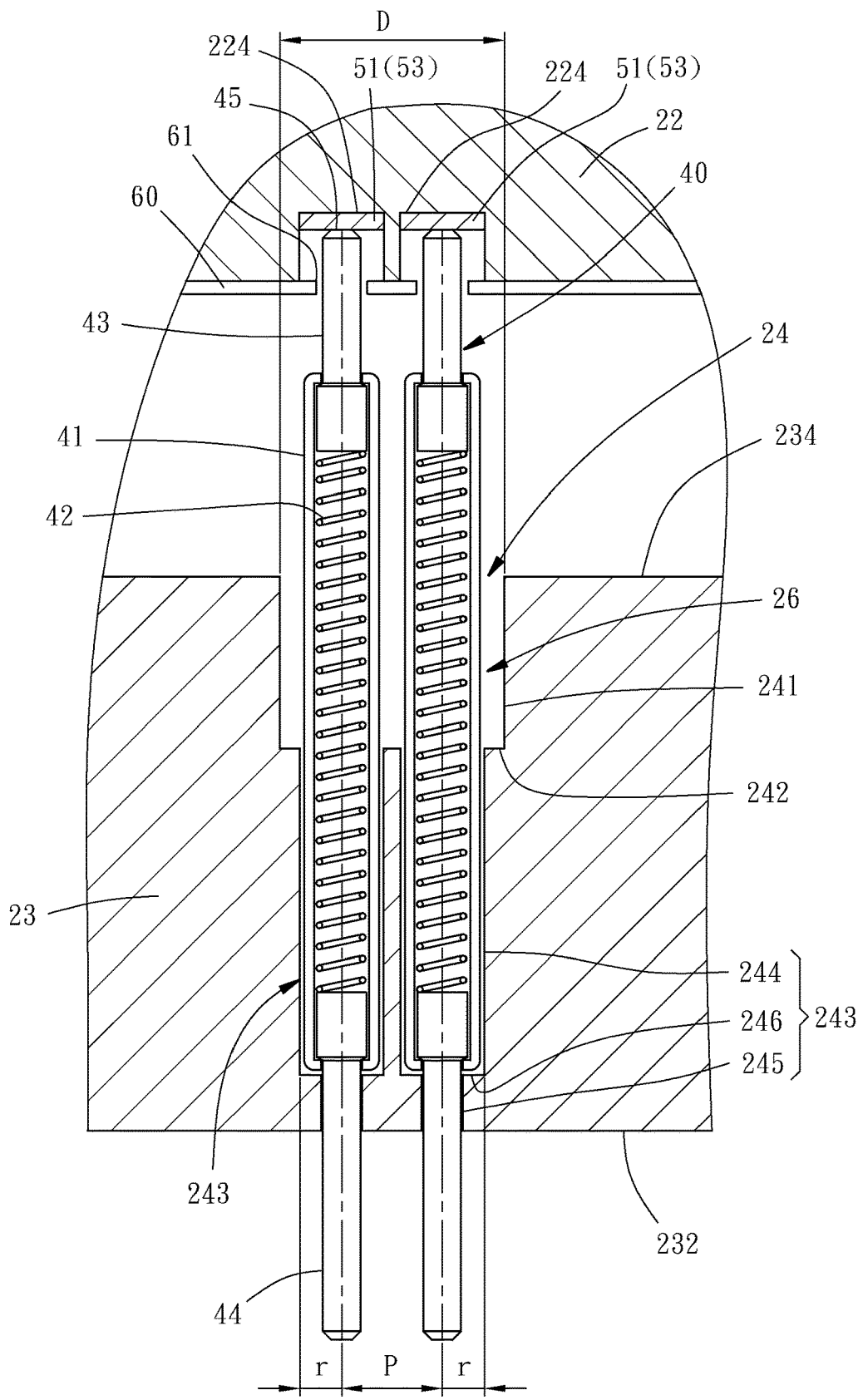
FIG. 2 is a partially sectional view taken along anyone of the lines 2-2 in FIG. 1.

Referring to FIGS. 1-2, a probe head 10 for high frequency signal test and medium or low frequency signal test at the same time according to a first preferred embodiment of the present invention includes a probe seat 20, a plurality of first spring probes 30, a plurality of second spring probes 40, and a plurality of electrically conductive layers 50. The probe head in this embodiment or each following embodiment may actually have many first spring probes 30, second spring probes 40 and electrically conductive layers 50, wherein the amount of the first spring probe 30 is usually much more than the amount of the second spring probe 40 and one electrically conductive layer 50 corresponds to several second spring probes 40, so the amount of the electrically conductive layer 50 is less than the amount of the second spring probe 40. For the simplification of the figures and the convenience of illustration, the figures of the present invention only show one first spring probe 30, a few second spring probes 40 and one electrically conductive layer 50 for illustrative purpose.

The probe seat 20 includes an upper die 21, a middle die 22 and a lower die 23. In this embodiment, each of the upper, middle and lower dies 21, 22 and 23 is composed of only one plate. However, according to the requirements of design and machining, each of the upper, middle and lower dies 21, 22 and 23 may be composed of a plurality of plates piled on one another. Each of the upper, middle and lower dies 21, 22 and 23 has a top surface 211, 221 or 231 and a bottom surface 212, 222 or 232, which face toward opposite directions. The middle die 22 is disposed between the bottom surface 212 of the upper die 21 and the top surface 231 of the lower die 23. There may, but unlimited to, be a positioning film 60 disposed between the bottom surface 222 of the middle die 22 and the top surface 231 of the lower die 23. The positioning film 60 has a plurality of positioning holes 61, through which the first and second spring probes 30 and 40 are inserted, respectively. In this way, the first and second spring probes 30 and 40 can be positioned by the positioning film 60 when being installed, making the assembly of the probe head 10 relatively easier.

The upper, middle and lower dies 21, 22 and 23 have a plurality of upper, middle and lower through holes 213, 223 and 233, respectively. The figures of the present invention only show one upper through hole 213, one middle through hole 223 and one lower through hole 233 for concise illustration. Each of the upper and lower through holes 213 and 233 has a larger radius portion 213a or 233a equal in inner radius to the middle through hole 223, and a smaller radius portion 213b or 233b smaller in inner radius than the larger radius portion 213a or 233a. The first spring probe 30 is inserted through an upper through hole 213, a middle through hole 223 and a lower through hole 233, which are coaxial with each other. This means the first spring probe 30 penetrates through the upper and bottom surfaces of the upper, middle and lower dies 21, 22 and 23. In this embodiment, the first spring probe 30 is a traditional spring probe, which includes a shell 35, a spring 36 disposed in the shell 35, and upper and lower shafts 32 and 31 abutted on two ends of the spring 36 respectively and extending out of top and bottom ends of the shell 35 respectively, wherein the spring 36 is a traditional coil spring processed by machining. However, the first spring probe 30 in the present invention is unlimited to the afore-described traditional spring probe, but may be a probe having a spring or other kinds of elastic structure processed by photolithography or other processing technologies, so that it is convenient to obtain the required elastic compression stroke and probing pressure by setting the coil number of the spring during the processing. The part of the lower shaft 31 of the first spring probe 30 protruding out of the bottom end of the shell 35 is inserted through the smaller radius portion 233b of the lower through hole 233, and the bottom end of the shell 35 is abutted on the boundary between the larger and smaller radius portions 233a and 233b of the lower through hole 233, so that the first spring probe 30 is prevented from falling out of the probe seat 20.

The lower die 23 in this embodiment further has a plurality of lower installation hole units 24, only two of which are shown in the figures of this embodiment. As shown in FIG. 2, each lower installation hole unit 24 includes a recess 241 recessed from another top surface 234 of the lower die 23, and two lower installation holes 243 penetrating through a bottom surface 242 of the recess 241 and the bottom surface 232 of the lower die 23. Each lower installation hole 243 includes a larger radius portion 244 connected with the bottom surface 242 of the recess 241, and a smaller radius portion 245 extending from the bottom end of the larger radius portion 244 to the bottom surface 232 of the lower die 23, wherein the inner radius of the smaller radius portion 245 is smaller than the inner radius of the larger radius portion 244. Each lower installation hole unit 24 accommodates two second spring probes 40 inserted through the two lower installation holes 243 respectively, and each second spring probe 40 is partially located in the recess 241. In this embodiment, the second spring probe 40 is a traditional spring probe, which includes a shell 41, a spring 42 disposed in the shell 41, and upper and lower shafts 43 and 44 abutted on two ends of the spring 42 respectively and extending out of top and bottom ends of the shell 41 respectively, wherein the spring 42 is a traditional coil spring processed by machining. However, the second spring probe 40 in the present invention is unlimited to the traditional spring probe, but may be a probe having a spring or other kinds of elastic structure processed by photolithography or other processing technologies. The lower shaft 44 of the second spring probe 40 is inserted through the smaller radius portion 245 of the lower installation hole 243, and the bottom end of the shell 41 of the second spring probe 40 is abutted on a stopping surface 246 located between the larger and smaller radius portions 244 and 245 of the lower installation hole 243, so that the second spring probe 40 is prevented from falling out of the probe seat 20.

Figure 6:
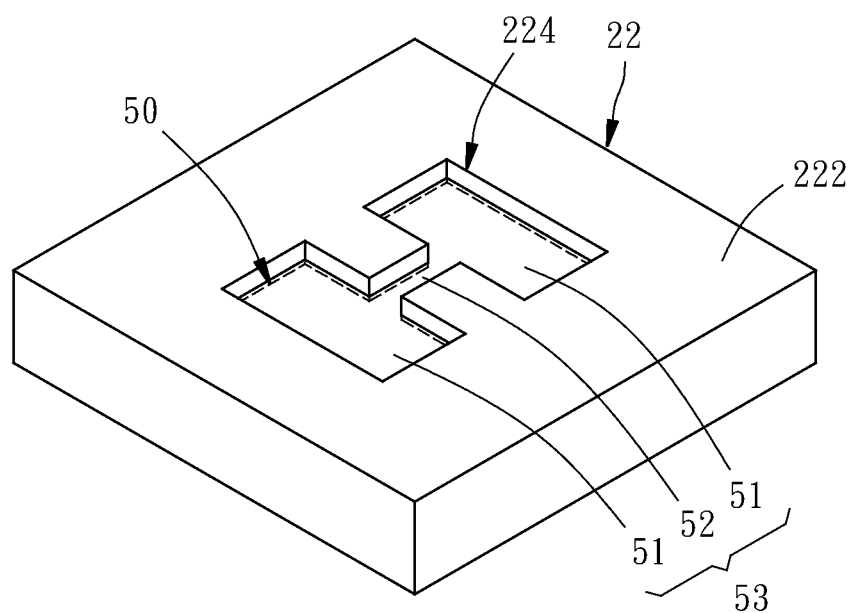
FIGS. 6-7 are schematic perspective views of a part of a middle die of the probe head, but showing two other types of the middle die.
Figure 11:
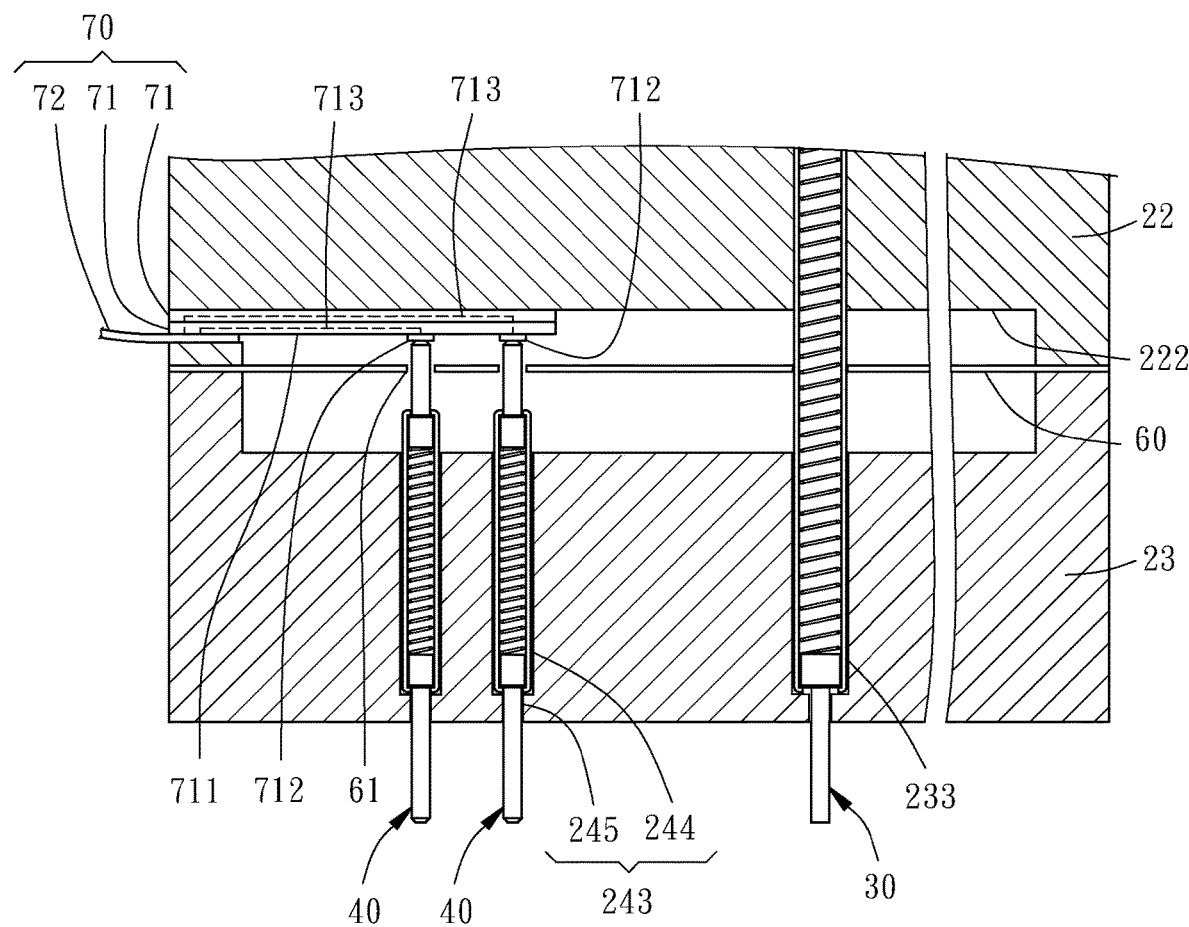
FIG. 11 is a schematic sectional view of a part of a probe head for high frequency signal test and medium or low frequency signal test at the same time according to a third preferred embodiment of the present invention.

As shown in FIGS. 1-2, the middle die 22 in this embodiment is provided on the bottom surface 222 thereof with a plurality of recesses 224. FIG. 2 only shows two recesses 224, only one of which is shown in FIG. 1. Each of the abovementioned lower installation hole units 24 corresponds to two second spring probes 40 as shown in FIG. 2, which are relatively less distanced from each other and electrically insulated from each other. Each of the recesses 224 corresponds to two second spring probes 40 as shown in FIG. 1, which are relatively more distanced from each other and electrically connected with each other through a conducting area 53 of the electrically conductive layer 50. Each of the recesses 224 is shaped similar to the recess 224 shown in FIG. 6, and the conducting area 53 disposed therein includes two abutted sections 51 and a connecting section 52 connecting the two abutted sections 51. Each of the abutted sections 51 is abutted by the top end of a second spring probe 40. The electrically conductive layer 50 shown in FIGS. 1 and 2 has two conducting areas 53. Each conducting area 53 and the two second spring probes 40 connected to the abutted sections 51 of the conducting area 53 form a signal transmitting path, and the second spring probes 40 connected to the two conducting areas 53 are arranged as a differential probe set for differential signaling. This means the two conducting areas 53 of the electrically conductive layer 50 and four second spring probes 40 arranged in a matrix form two signal transmitting paths, and the two signal transmitting paths are adapted for transmitting differential signals opposite in phase, which means the differential signals have a phase difference of 180 degrees. In other words, the four second spring probes 40, two lower installation hole units 24, two recesses 224 and one electrically conductive layer 50 shown in the figures of this embodiment are electrically associated with each other. However, the second spring probes 40 in the present invention are unlimited to be arranged as a differential probe set. This means there may be only a pair of second spring probes 40 electrically connected with each other as shown in FIG. 1, and each lower installation hole unit 24 may have only one lower installation hole 243, like the arrangement of the lower die 23 and the second spring probes 40 as shown in FIG. 11. In such case, the electrically conductive layer 50 has only one conducting area 53 as shown in FIG. 6, for electrically connecting two second spring probes 40.

As shown in FIG. 1, when the assembly of the above-described probe head 10 is accomplished, the top end 33 of the first spring probe 30 protrudes out of the top surface 211 of the upper die 21. After that, the top surface 211 of the upper die 21 is fastened to a main circuit board (not shown), so that the probe head 10 and the main circuit board compose a probe card. Alternatively, the top surface 211 of the upper die 21 is fastened to a space transformer (not shown) and the space transformer is fastened to a main circuit board (not shown), so that the probe head 10, the space transformer and the main circuit board compose a probe card. At this time, the spring of the first spring probe 30 is a little compressed to make the top end 33 of the first spring probe 30 draw back into the upper through hole 213 and abutted against an electric contact (not shown) of the main circuit board or the space transformer. The main circuit board is adapted to be electrically connected with a testing machine (not shown). Broadly speaking, the testing machine mentioned in the present invention may be the testing machine used in the integrated circuit testing factory for testing the DUTs. Further speaking, the testing machine may be a testing apparatus capable of transmitting high frequency test signals.

As a result, when the bottom end 34 of the first spring probe 30 contacts an electric contact of a DUT (not shown), the first spring probe 30 is adapted to transmit test signal between the testing machine and the DUT. Because the first spring probe 30 is relatively longer in length, it is relatively more suitable to transmit ground signal, power signal or general medium or low frequency signal. Besides, two of the four second spring probes 40 serve as signal transmitting probes (TX probes) for probing high frequency signal transmission contacts (TX) of the DUT, and the other two second spring probes 40 serve as signal receiving probes (RX probes) for probing high frequency signal reception contacts (RX) of the DUT. Further speaking, the two second spring probes 40 shown in FIG. 1 may be respectively a positive TX probe and a positive RX probe, or a negative TX probe and a negative RX probe, and the two second spring probes 40 shown in FIG. 2 may be respectively a positive TX probe and a negative TX probe, or a positive RX probe and a negative RX probe. The aforementioned term 'positive' means the associated probe transmits the signal having positive phase, and the aforementioned term 'negative' means the associated probe transmits the signal having negative phase. In the case that the probes are not used to transmit differential signals, two second spring probes 40 serve as a signal transmitting probe (TX probes) and a signal receiving probe (RX probes) respectively for probing a high frequency signal transmission contact (TX) and a high frequency signal reception contact (RX) of the DUT, respectively. In this way, a high frequency test signal can be outputted from the high frequency signal transmission contact of the DUT and transmitted to the high frequency signal reception contact of the DUT through the TX probe, the electrically conductive layer 50 and the RX probe in order for performing high frequency signal loopback test. Therefore, the second spring probe 40 can be manufactured to be relatively shorter and thicker to satisfy the requirements of the electrical properties of high frequency testing, and the first spring probe 30 can be manufactured to be relatively longer and thinner to meet the requirement of fine pitch, so that the testing requirements of the whole IC are met.

It can be known from the above description that the probe head of the present invention primarily transmits a first test signal by a first spring probe 30 and transmits a second test signal by at least two second spring probes 40, wherein the frequency of the second test signal is higher than the frequency of the first test signal, which means the first test signal is the aforementioned ground signal, power signal or general medium or low frequency signal and the second test signal is the aforementioned high frequency signal.

As described above, the types of the first and second spring probes 30 and 40 in the present invention are unlimited. However, the second spring probe 40 is much shorter in length than the first spring probe 30. Therefore, no matter what type the second spring probe 40 is, the elastic compression stroke and probing pressure thereof are relatively more difficult to be controlled. On the other hand, the first spring probe 30 is relatively longer, so the elastic compression stroke and probing pressure thereof are relatively easier to be controlled. Therefore, it is convenient to make the elastic compression stroke and probing pressure of the first spring probe 30 correspond to the elastic compression stroke and probing pressure of the second spring probe 40. Besides, there may be more other thick and short spring probes (not shown) configured similar to the second spring probe 40 and disposed around the second spring probes 40 for serving as ground probes, and there may be ground conductive layers (not shown) disposed around the electrically conductive layer 50 and electrically connected with the ground probes, so that the high frequency signal transmitting paths are surrounded by ground signal transmitting paths and thereby have better electrical properties. In addition, one of the upper, middle and lower dies 21, 22 and 23 may, but unlimited to, be different in material from the others. For example, the upper, middle and lower dies 21, 22 and 23 may be all made of machinable ceramic. Alternatively, the middle die 22 may be a substrate easy for circuits to be disposed thereon, such as a printed circuit board (also referred to as PCB), a multi-layer ceramic substrate (also referred to as MLC) or a multi-layer organic substrate (also referred to as MLO), so that the electrical properties of the probe head 10 are adjustable to benefit the matching of capacitance and inductance and the middle die is easy to be manufactured as the types shown in FIGS. 6, 7, 9 and 10. Alternatively, the electrically conductive layer for electrically connecting two second spring probes 40 may be composed of layered wiring inside the middle die 22 and contact pads for attaining the functions of the abovementioned connecting section 52 and abutted sections 51 respectively, thereby increasing the spatial flexibility elasticity and diversity of the arrangement of the electrically conductive layer. Alternatively, the electrically conductive layer 50 may be or include an electrically conductive film having a conductive wiring layer or a plurality of conductive wiring layers piled on one another and electrically insulated from each other, to be electrically connected with two second spring probes 40 by the trace arranged in the electrically conductive film, thereby increasing the spatial flexibility and diversity of the arrangement of the electrically conductive layer.

Figure 3:
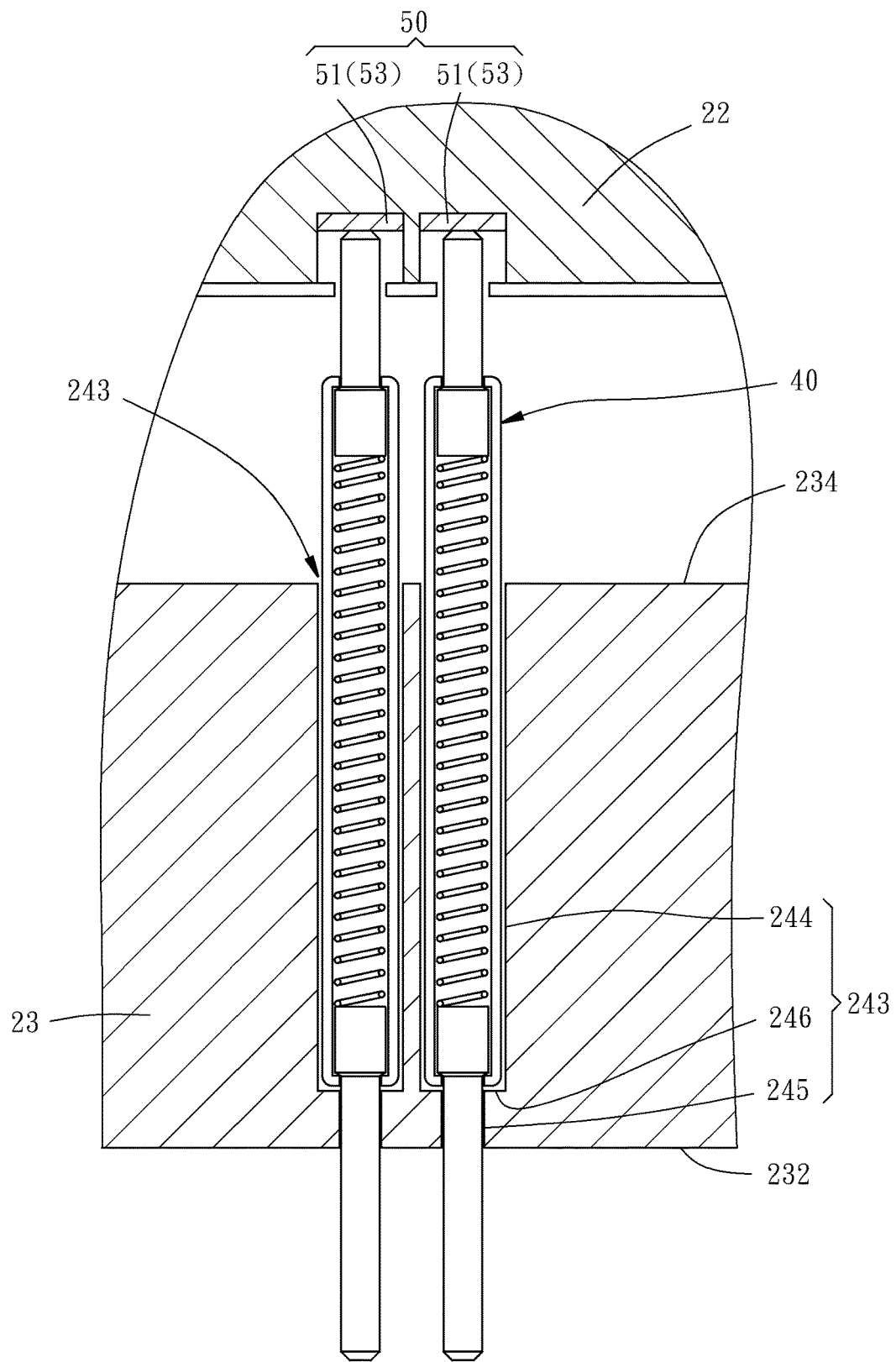
FIGS. 3-5 are similar to FIG. 2, but showing different types of a lower die of the probe head.
Figure 4:
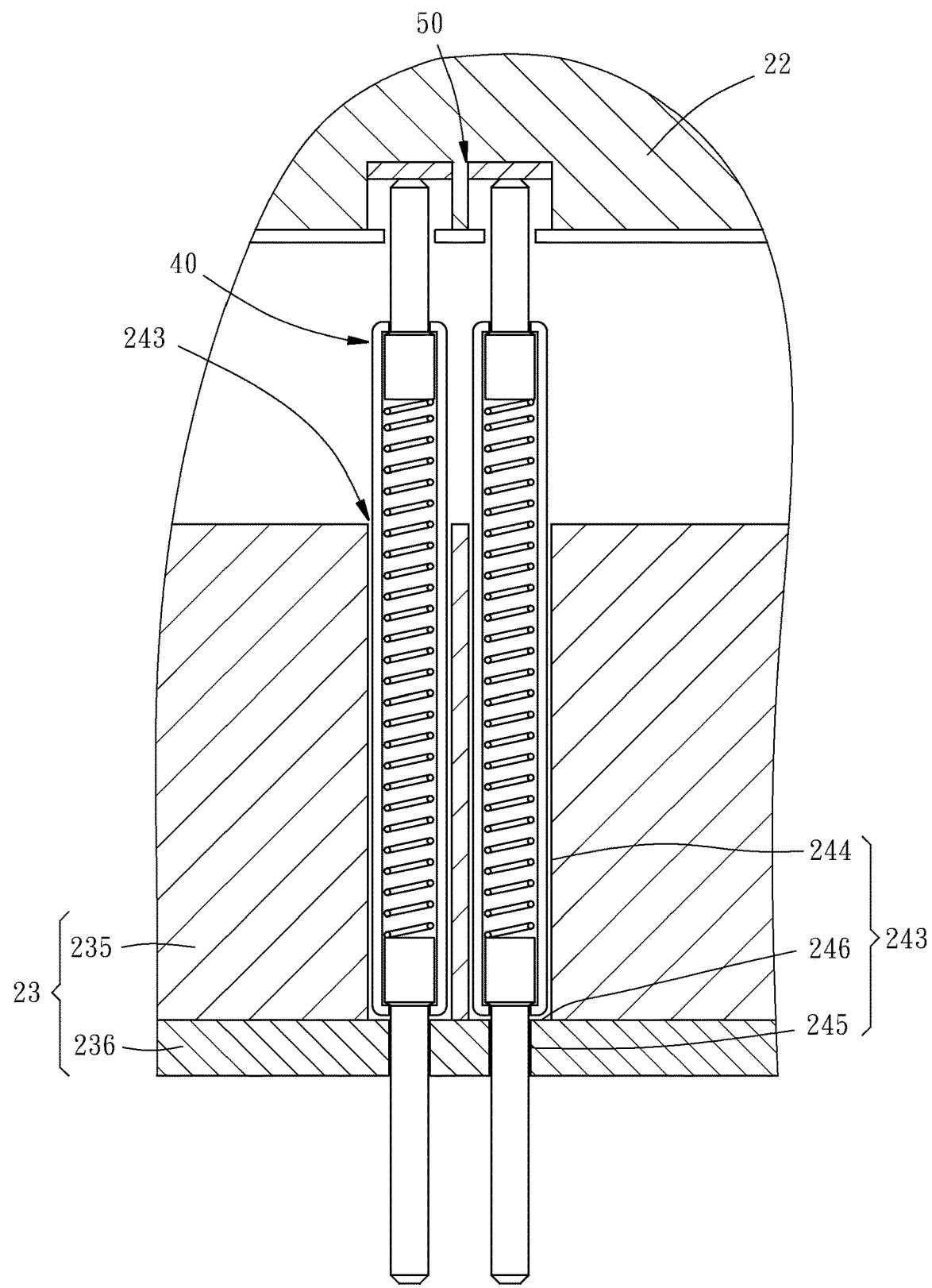
Figure 5:
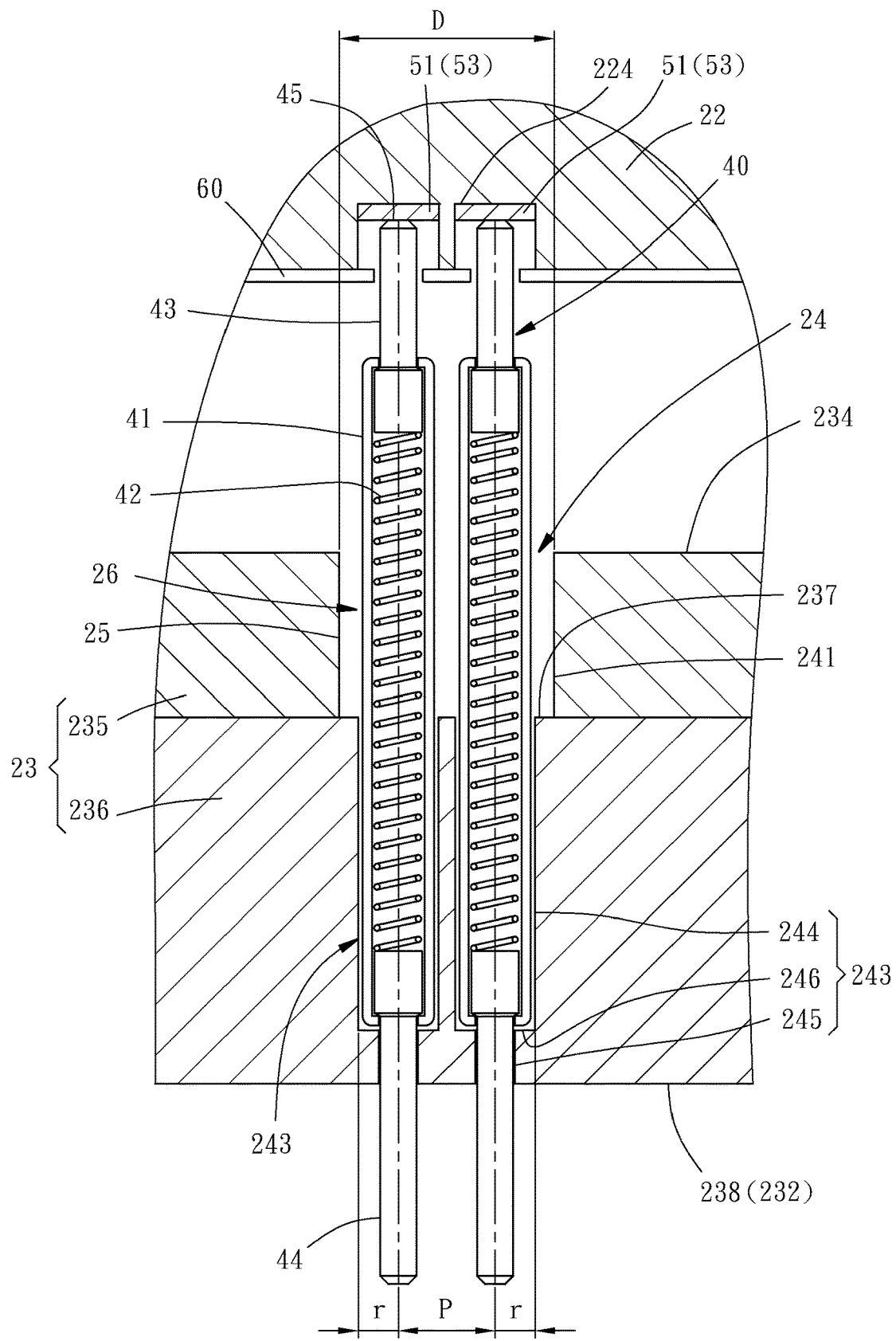

In the case shown in FIG. 1 and FIG. 2, two second spring probes 40 arranged as a differential pair for differential signaling are partially located in the same recess 241. Such feature benefits the matching of capacitance and inductance, thereby enhancing the performance of the probe card. The shape of the recess 241 is unlimited. For example, the cross-section of the recess 241 may be shaped as a circle or a non-circle. The aforementioned non-circle includes a quadrilateral (e.g. square or rectangle), a polygon or an irregular shape. The length of the shortest side of the quadrilateral, polygon or irregular shape or the diameter of the circle D is larger than the sum of the pitch P between the second spring probes 40 located in the same lower installation hole unit 24, i.e. the second spring probes 40 arranged as a differential pair for differential signaling, and the largest diameter of the lower installation hole 243, which is the diameter of the larger radius portion 244 in FIG. 2, i.e. the twice of the radius r of the larger radius portion 244. That is, D>P+2r. However, the lower die 23 is unlimited to have the afore-described recess 241, but may be configured as shown in FIG. 3, wherein each lower installation hole 243 penetrates through the top surface 234 and bottom surface 232 of the lower die 23. The lower die 23 in FIG. 3 is composed of only one plate, so the larger and smaller radius portions 244 and 245 of the lower installation hole 243 are located at the same plate. However, as shown in FIG. 4, the lower die 23 may be composed of two plates 235 and 236 piled on one another, and the larger and smaller radius portions 244 and 245 of each lower installation hole 243 are located at the two plates 235 and 236, respectively. This solution is relatively more beneficial to the drilling process. Alternatively, as shown in FIG. 5, the aforementioned recess 241 may be formed by upper and lower plates 235 and 236 piled on one another. Specifically speaking, the lower installation hole 243 for accommodating a single second spring probe 40 penetrates through the top surface 237 and bottom surface 238 of the lower plate 236. The upper plate 235 has an upper through hole 25 communicating with two lower installation holes 243, so that the upper through hole 25 and the top surface 237 of the lower plate 236 collectively form the aforementioned recess 241, in which the two second spring probes 40 are partially accommodated. This solution not only attains the aforementioned effect of enhancing the performance of the probe card, but also has the advantage of ease of machining.

Figure 18:
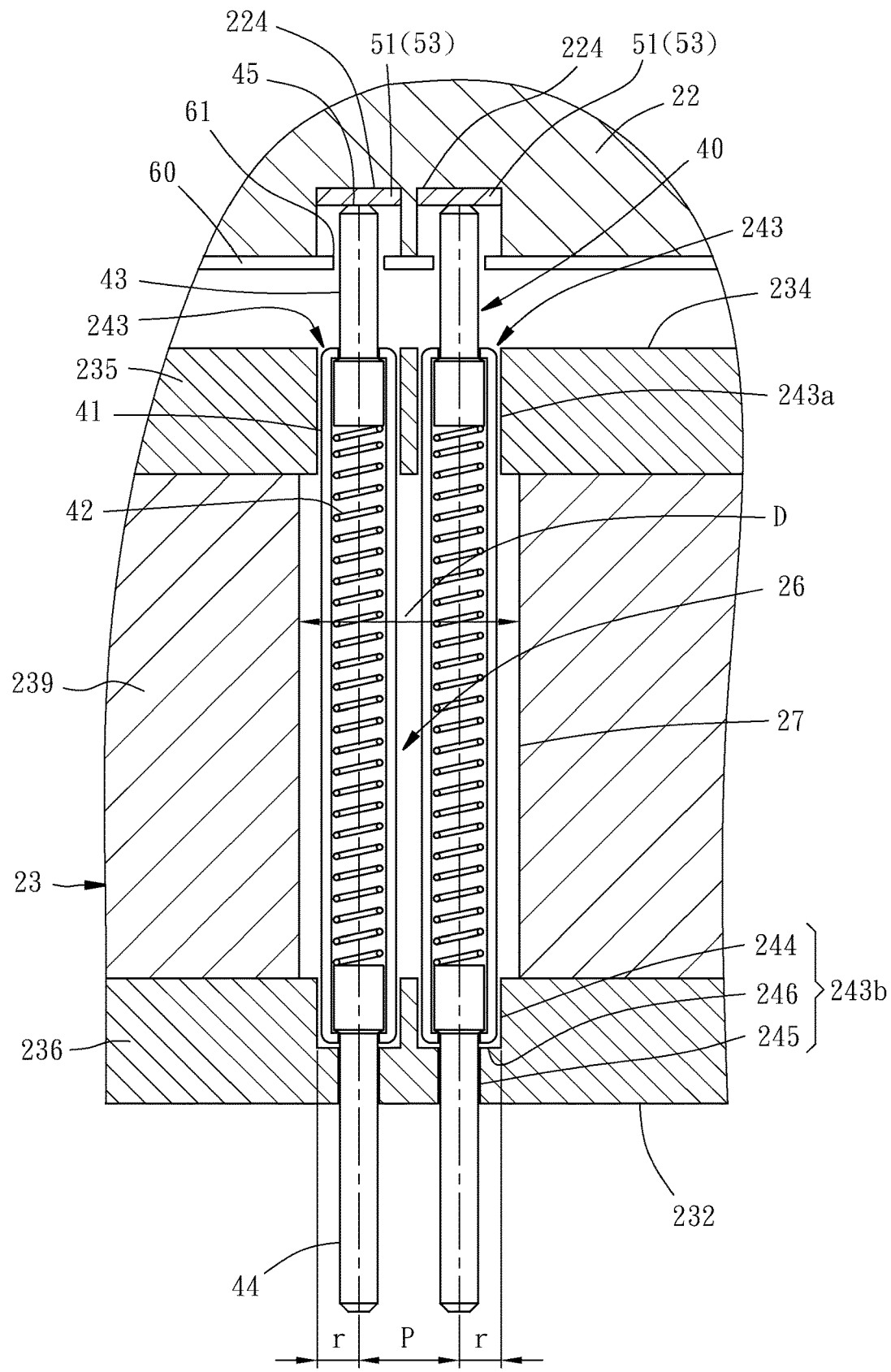
FIG. 18 is similar to FIG. 2, but showing a different type of the lower die of the probe head.

In the above-described types of the lower die 23 as shown in FIG. 2 and FIG. 5, the lower die 23 is provided with the recess 241 opened on the top surface 234 of the lower die 23 to have a communicating space 26 in the recess 241, so that two second spring probes 40 arranged as a differential pair for differential signaling are partially located in the same communicating space 26, thereby enhancing the performance of the probe card. However, as shown in FIG. 18, the communicating space 26 may be not opened, but provided inside the lower die 23. Specifically speaking, the lower die 23 includes a lower plate 236, a middle plate 239 and an upper plate 235 piled in order, and each lower installation hole 243 includes an upper section 243a penetrating through the upper plate 235 and a lower section 243b penetrating through the lower plate 236 and including the larger radius portion 244 and the smaller radius portion 245. The middle plate 239 has a middle through hole 27, in which the communicating space 26 is provided. The communicating space 26 is located between the upper section 243a and the lower section 243b of each of the lower installation holes 243. The upper section 243a extends downwardly from the top surface 234 of the lower die 23 to the communicating space 26, and the lower section 243b extends upwardly from the bottom surface 232 of the lower die 23 to the communicating space 26. Such communicating space 26 hidden inside the lower die 23 can also attain the aforementioned effect of enhancing the performance of the probe card, and such lower die 23 has a better support effect to the probes relatively better. Like the above-described recess 241, the cross-section of the middle through hole 27 as shown in FIG. 18 may be shaped as a circle or a non-circle. The aforementioned non-circle includes a quadrilateral (e.g. square or rectangle), a polygon or an irregular shape. The length of the shortest side of the quadrilateral, polygon or irregular shape or the diameter of the circle D is larger than the sum of the pitch P between the second spring probes 40 located in the same lower installation hole unit 24, i.e. the second spring probes 40 arranged as a differential pair for differential signaling, and the largest diameter of the lower installation hole 243, which is the diameter of the larger radius portion 244 in FIG. 18, i.e. the twice of the radius r of the larger radius portion 244. That is, D>P+2r.

It should be noted that the communicating space 26 mentioned in the present invention is a part of the lower installation hole unit 24. The communicating space 26 directly communicates with only the lower installation holes 243 included in the lower installation hole unit 24 which the communicating space 26 belongs to, but not directly communicates with the other lower installation holes 243 or the lower through holes 233, which don't belong to the same lower installation hole unit 24, so the communicating space 26 accommodates only second spring probes 40. Besides, the lower installation hole unit 24 mentioned in the present invention is defined as being penetrated through the top surface 234 and bottom surface 232 of the lower die 23, which means the top end of the lower installation hole unit 24 is located on the top surface 234. It can be known from the figures of the present invention that the lower die 23 may, but not necessarily, have a space communicating with all the lower installation hole units 24 and lower through holes 233. The space is located above the top surface 234 of the lower die 23, and all the first and second spring probes 30 and 40 are partially located in the space. From the afore description, it is understandable that the space is not a part of any single lower installation hole unit 24 and doesn't communicate with only the lower installation holes 243 included in one lower installation hole unit 24. Therefore, the space above the top surface 234 of the lower die 23 can't be regarded as the communicating space 26 mentioned in the present invention. In other words, in the present invention the part of the probe for transmitting high frequency loopback test signal, i.e. second spring probe 40, located in the communicating space 26 is segregated from the probe for transmitting medium or low frequency signal, i.e. first spring probe 30 or fifth spring probe 95 in FIG. 19. That is, they are segregated by a part of the lower die 23 located therebetween.

It can be known from the above description that the probe head 10 uses the relatively longer first spring probe 30 penetrating through the whole probe seat 20 to perform medium or low frequency signal test and uses the electrically conductive layer 50 and the relatively shorter second spring probes 40 not penetrating through the whole probe seat 20 to perform high frequency signal loopback test. In order to make the second spring probe 40 obviously shorter in length than the first spring probe 30, the electrically conductive layer 50 should be at least lower than the top surface 211 of the upper die 21, so that the top end 45 of the second spring probe 40 is located inside the probe seat 20. In other words, the electrically conductive layer 50 may be disposed on one of the upper, middle and lower dies 21, 22 and 23. As long as the electrically conductive layer 50 is located between the top surface 211 of the upper die 21 and the bottom surface 232 of the lower die 23, it satisfies the condition of being located inside the probe seat 20. For example, the electrically conductive layer 50 may be disposed on the bottom surface 212 of the upper die 21, the top surface 221 of the middle die 22, the bottom surface 222 of the middle die 22 or the top surface 231 of the lower die 23, or disposed in a recess recessed from the top or bottom surface of the upper, middle or lower die 21, 22 or 23. However, in the case that the electrically conductive layer 50 is disposed on the bottom surface 222 of the middle die 22 and/or the recess 224 thereof, the second spring probe 40 can be provided with the most appropriate length, and the electrically conductive layer 50 can be formed by electroplating and thereby have the advantage of ease of manufacturing. Likewise, the electrically conductive layer 50 can be formed on the bottom surface 212 of the upper die 21 by electroplating for having the same advantage. Besides, the electrically conductive layer 50 may be formed by chemical plating.

Figure 7:
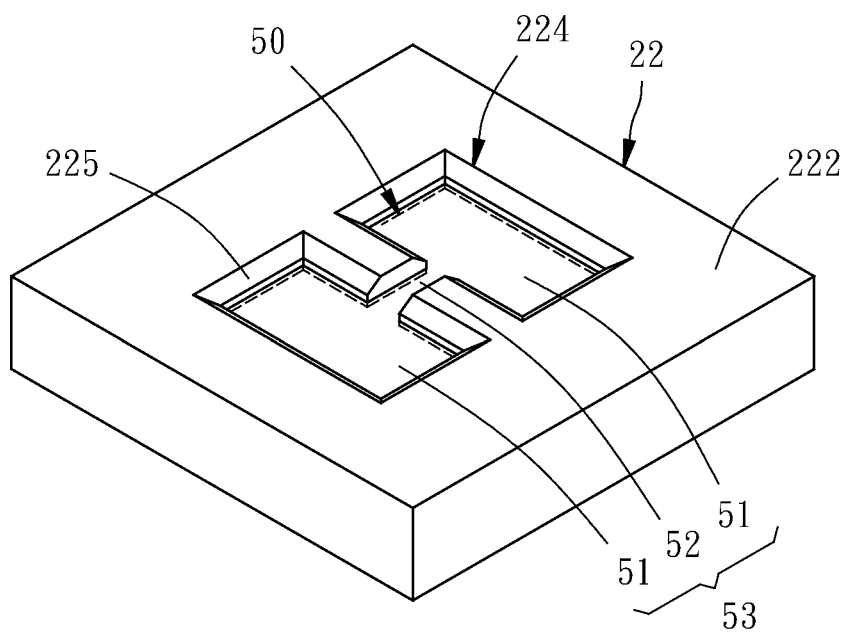
Figure 8A:
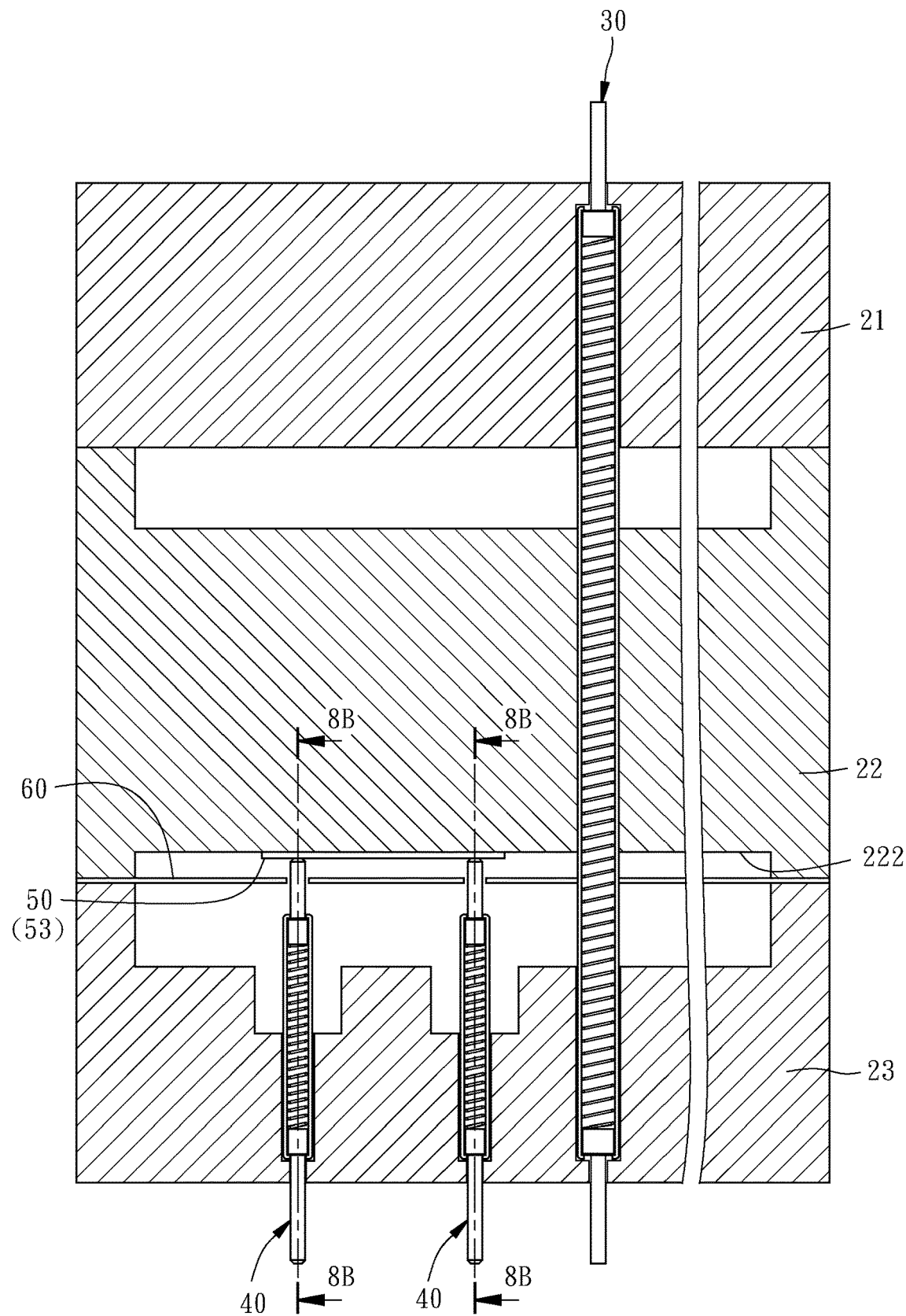
FIG. 8A is a schematic sectional view of a probe head for high frequency signal test and medium or low frequency signal test at the same time according to a second preferred embodiment of the present invention.
Figure 8B:
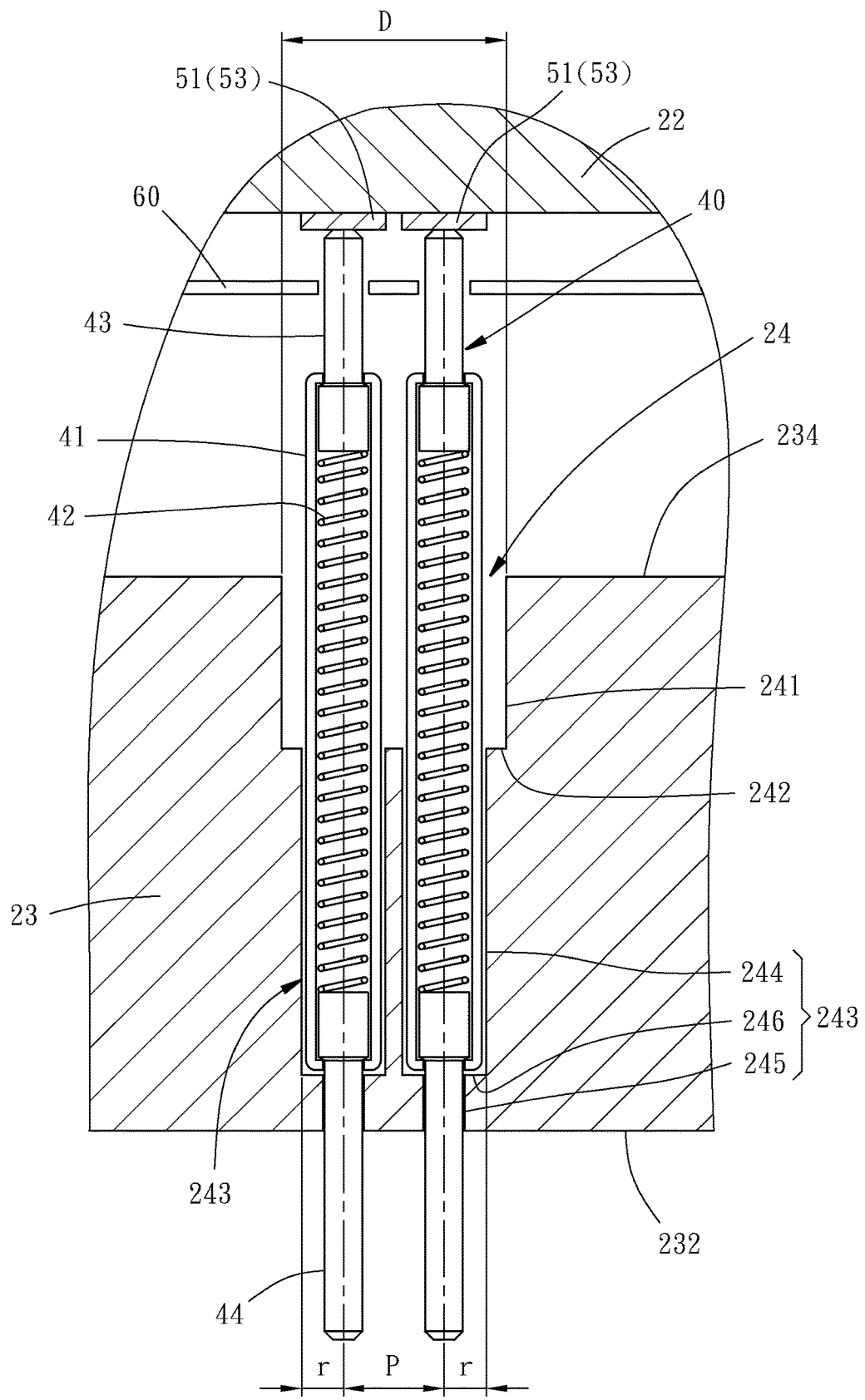
FIG. 8B is a partially sectional view taken along anyone of the lines 8B-8B in FIG. 8A.
Figure 9:
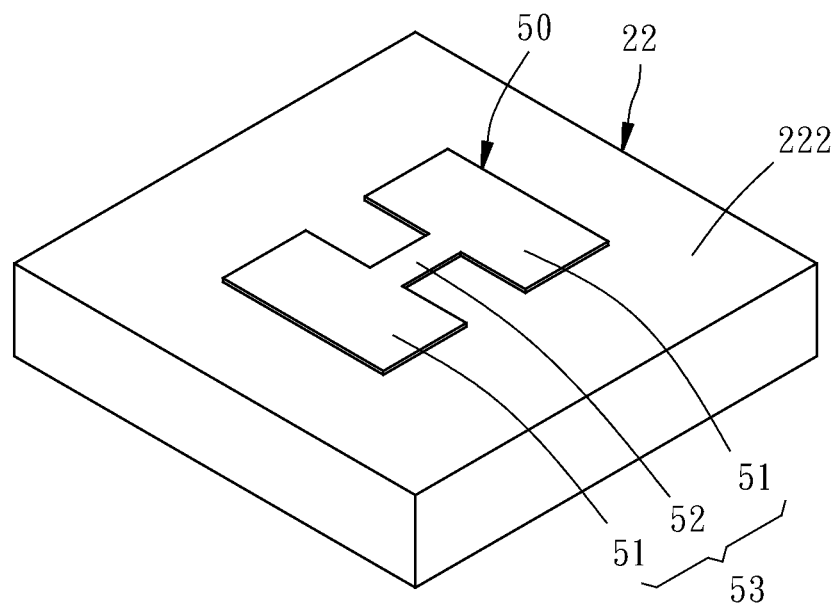
FIGS. 9-10 are schematic perspective views of a part of a middle die of the probe head, but showing two other types of the middle die.
Figure 10:
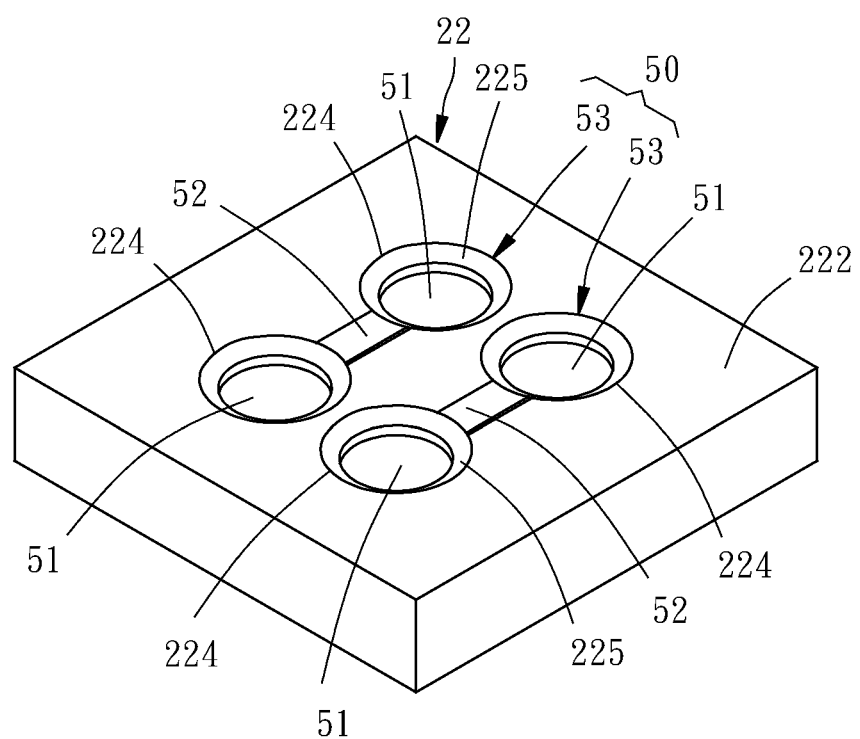

In the above-described first preferred embodiment, the two conducting areas 53 of the electrically conductive layer 50 are located in two recesses 224, respectively. However, the two conducting areas 53 may be located in the same recess 224. In other words, the single recess 224 as shown in FIG. 6 may be provided therein with the electrically conductive layer 50 having only one conducting area 53 for corresponding to one signal transmitting path, or provided with a plurality of connecting lines for corresponding to a plurality of signal transmitting paths. Secondly, as shown in FIG. 7, the recess 224 may be provided on the periphery thereof with a chamfering 225 or a fillet for guiding probes during the installation of the probes, thereby enhancing the positioning accuracy of probe installation. Alternatively, the abutted sections 51 and connecting section 52 of the electrically conductive layer 50 may be all disposed on the bottom surface 222 of the middle die 22, such as those in a second preferred embodiment of the present invention as shown in FIGS. 8A, 8B and 9. FIG. 9 shows the case that the electrically conductive layer 50 has only one conducting area 53, and the abutted sections 51 and connecting section 52 of the conducting area 53 are all disposed on the bottom surface 222 of the middle die 22. In the case as shown in FIGS. 8A and 8B that the electrically conductive layer 50 has two conducting areas 53 for transmitting differential signals, two conducting areas 53 similar to the conducting area 53 shown in FIG. 9 are both disposed on the bottom surface 222 of the middle die 22. In practice, the electrically conductive layer 50 is unlimited to be divided into abutted sections 51 and connecting section 52. For example, the electrically conductive layer may be composed of the wiring and conductive holes (e.g. conductive via, blind hole and/or buried hole) inside the die and/or exposed contact pads. Alternatively, the abutted sections 51 and connecting section 52 of the same conducting area 53 are unlimited to be collectively located in the same recess or on the same plane. For example, in the configuration shown in FIG. 10, the middle die 22 and the electrically conductive layer 50 are configured similarly to the configuration shown in FIGS. 1 and 2, wherein the electrically conductive layer 50 includes two conducting areas 53 disposed in recesses 224. However, in FIGS. 1 and 2 the abutted sections 51 and connecting section 52 of the same conducting area 53 are collectively located in the same recess 224, but in FIG. 10 each abutted section 51 is individually disposed in a recess 224 and each connecting section 52 is disposed on the bottom surface 222 of the middle die 22 instead of any recess. In such case, each of the recesses 224 may be circular-shaped to further enhance the positioning accuracy of probe installation. The following description takes the configuration shown in FIG. 10 as an instance to further specify the case of the present invention for transmitting differential signals. The rear, front, left and right abutted sections 51 shown in FIG. 10 are adapted to be abutted by four second spring probes 40 one-to-one. The rear and left abutted sections 51 are connected by a connecting section 52, and thereby they form a conducting area 53 for being connected with two second spring probes 40 to form a signal transmitting path. The front and right abutted sections 51 are connected by another connecting section 52, and thereby they form another conducting area 53 for being connected with two other second spring probes 40 to form another signal transmitting path. For example, the left abutted section 51 is connected with the positive TX probe, the rear abutted section 51 is connected with the positive RX probe, the front abutted section 51 is connected with the negative TX probe, and the right abutted section 51 is connected with the negative RX probe.

In the probe head of each above embodiment, the second spring probes 40 are primarily aimed at high frequency signal loopback test, which means the high frequency test signal is not produced by the testing machine and not transmitted to the testing machine. In the probe head of each following embodiment, the second spring probes 40 are adapted to transmit high frequency signal between the DUT and the testing machine and thereby meet the high frequency testing requirement differing from that the probe head of each above embodiment can meet.

Referring to FIG. 11, a probe head for high frequency signal test and medium or low frequency signal test at the same time according to a third preferred embodiment of the present invention is similar to the probe head of the second preferred embodiment as shown in FIGS. 8A and 8B, but the lower die 23 in this embodiment is, but unlimited to be, configured without recess 241, like the lower die 23 shown in FIG. 3. This means the lower die 23 in this embodiment may be configured with recess 241 like the lower die 23 shown in FIGS. 1 and 2. Secondly, the second spring probe 40 in this embodiment is unlimited in amount, and each second spring probe 40 is disposed individually instead of electrically connected with another second spring probe 40. Besides, the electrically conductive layer 70 in this embodiment is composed of two electrically conductive films 71 and a flexible circuit board 72 and extends from the inside of the probe seat 20 to the outside of the probe seat 20, which will be specified below.

Like the above-described electrically conductive layer 50, the two electrically conductive films 71 may be disposed on one of the upper, middle and lower dies 21, 22 and 23, and most preferably being disposed on the bottom surface 222 of the middle die 22 or in a recess of the bottom surface 222. The amount of the electrically conductive film 71 is unlimited and may be changed according to requirements. The flexible circuit board 72 is connected to the bottom surface 711 of the lowest electrically conductive film 71 and extends from there through a lateral surface of the probe seat 20 to the outside of the probe seat 20. The afore-mentioned bottom surface 711 is further provided with electric contacts 712 equal in amount to the second spring probes 40, and the electrically conductive films 71 are provided therein with traces 713 equal in amount to the second spring probes 40. First ends of the traces 713 are electrically connected with the electric contacts 712, respectively. Second ends of the traces 713 are electrically connected with different traces (not shown) of the flexible circuit board 72, respectively. The top ends of the second spring probes 40 are abutted against the electric contacts 712 respectively, thereby electrically connected with the traces 713, respectively.

As a result, the flexible circuit board 72 of the electrically conductive layer 70 can be connected to the main circuit board of the probe card, so that the second spring probes 40 can be electrically connected with the testing machine through the traces 713 of the electrically conductive films 71, the traces of the flexible circuit board 72 and the main circuit board. Alternatively, the flexible circuit board 72 of the electrically conductive layer 70 can be directly connected to the testing machine, so that the second spring probes 40 can be electrically connected with the testing machine through the traces 713 of the electrically conductive films 71 and the traces of the flexible circuit board 72. In this way, the probe head in this embodiment can also use the relatively longer and thinner first spring probe 30 to transmit ground signal, power signal and general medium or low frequency signal between the testing machine and the DUT, and meanwhile use the relatively shorter and thicker second spring probes 40 to transmit high frequency signal between the testing machine and the DUT, so that the DUT can receive the high frequency test signal from the testing machine and transmit signal back to the testing machine for analysis. Therefore, the probe head in this embodiment can meet the requirements of fine pitch and high frequency testing at the same time, and meet the testing requirements of the whole IC. Besides, the traces 713 of the electrically conductive films 71 and the traces of the flexible circuit board 72 can be designed to benefit the matching of capacitance and inductance for enhancing the electrical properties of high frequency signal transmission.

Figure 12:
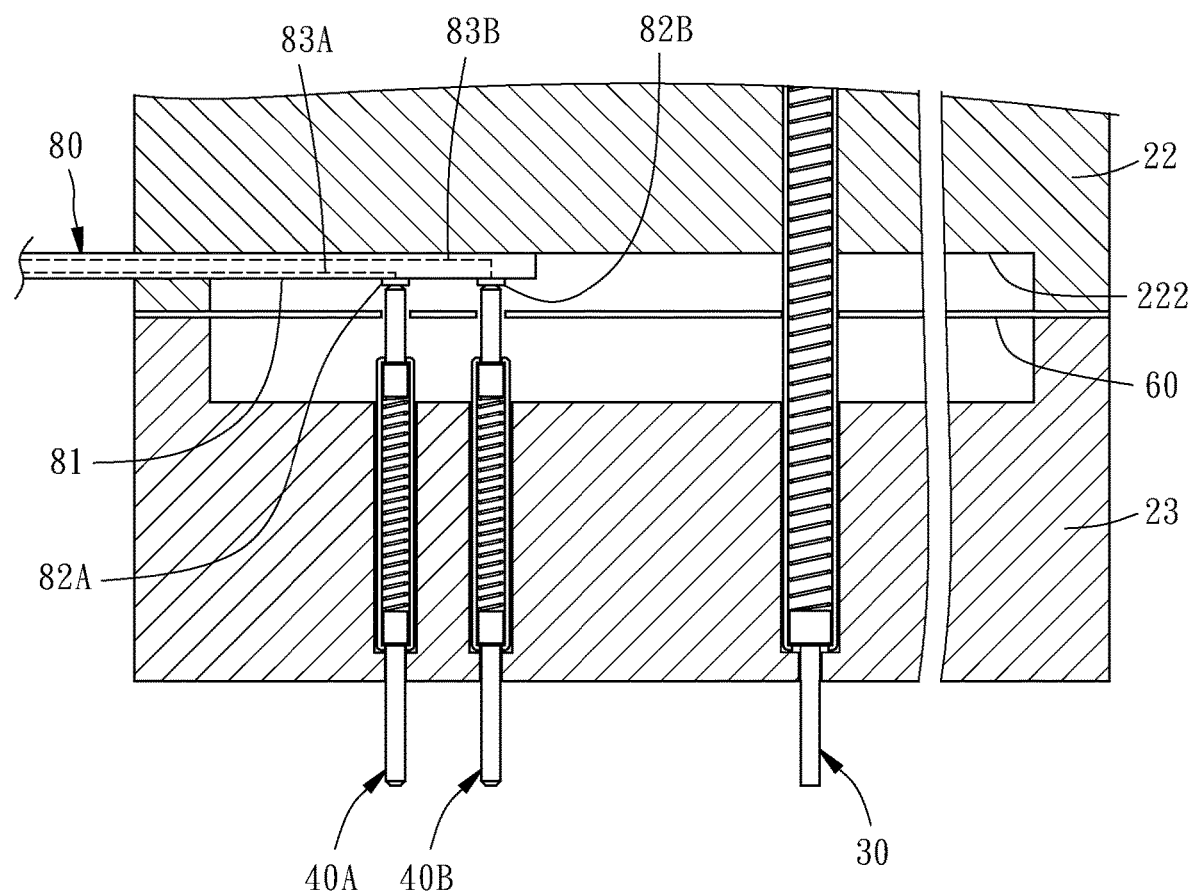
FIG. 12 is a schematic sectional view of a part of the probe head for high frequency signal test and medium or low frequency signal test at the same time according to a fourth preferred embodiment of the present invention.

Referring to FIG. 12, a probe head for high frequency signal test and medium or low frequency signal test at the same time according to a fourth preferred embodiment of the present invention is similar to the probe head in the third preferred embodiment as shown in FIG. 11. For example, the lower die 23 may be configured without recess 241 or with recess 241. However, the electrically conductive layer 80 in this embodiment is a flexible circuit board. A part of the flexible circuit board 80 is disposed inside the probe seat 20. This part is positioned as the above-described electrically conductive film 71 or electrically conductive layer 50. The other part of the flexible circuit board 80 extends through a lateral surface of the probe seat 20 to the outside of the probe seat 20. The part of the bottom surface 81 of the flexible circuit board 80 located inside the probe seat 20 is provided with electric contacts 82A and 82B equal in amount to the second spring probes 40, and the flexible circuit board 80 is provided therein with high speed traces 83A and 83B equal in amount to the second spring probes 40. An end of the high speed traces 83A and 83B are electrically connected with the electric contacts 82A and 82B, respectively. The top ends of the second spring probes 40 are abutted against the electric contacts 82A and 82B respectively, thereby electrically connected with the high speed traces 83A and 83B, respectively. As a result, the probe head in this embodiment can attain the same effects with the above-described third preferred embodiment.

Figure 13:
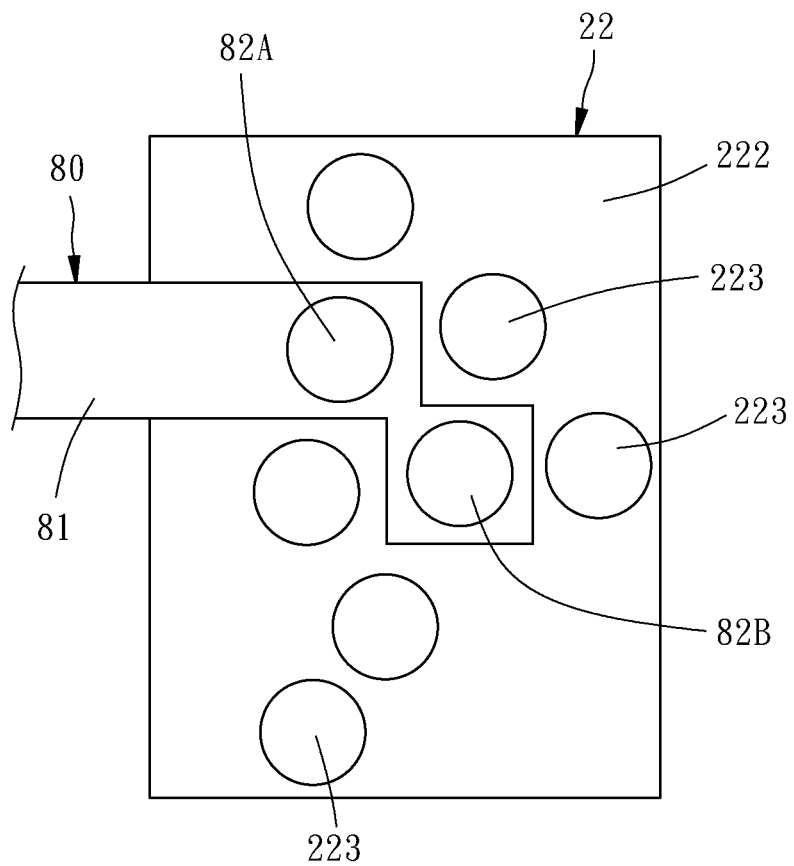
FIG. 13 is a schematic bottom view of a part of a middle die and an electrically conductive layer of the probe head for high frequency signal test and medium or low frequency signal test at the same time according to the fourth preferred embodiment of the present invention.
Figure 14:
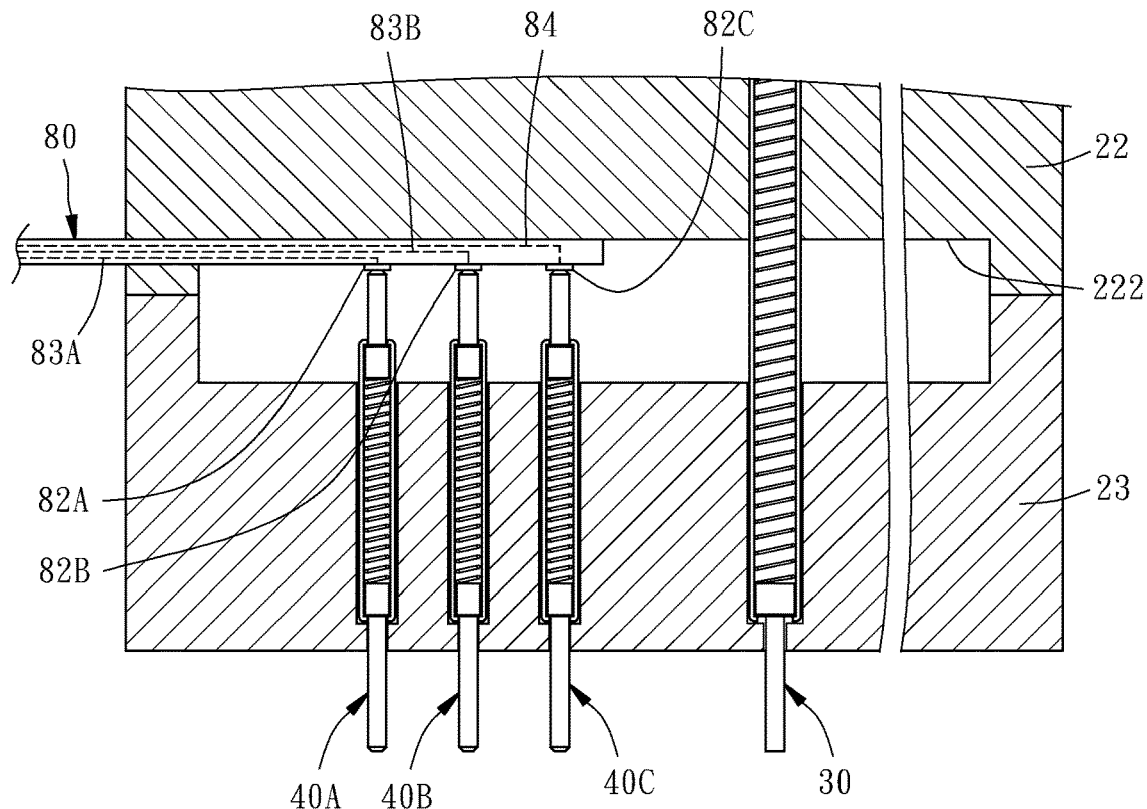
FIG. 14 is a schematic sectional view of a part of a probe head for high frequency signal test and medium or low frequency signal test at the same time according to a fifth preferred embodiment of the present invention.
Figure 15:
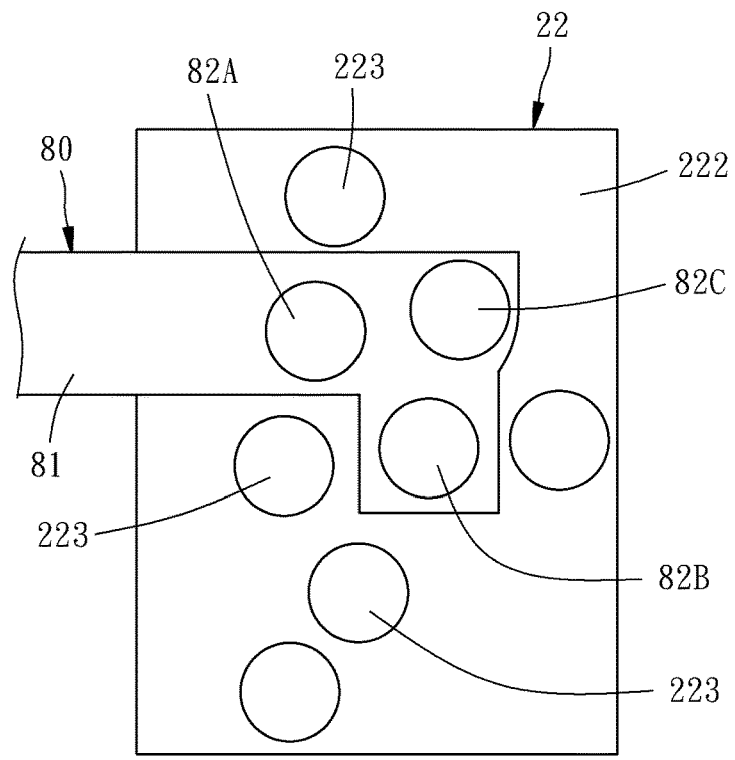
FIG. 15 is a schematic bottom view of a part of a middle die and an electrically conductive layer of the probe head for high frequency signal test and medium or low frequency signal test at the same time according to the fifth preferred embodiment of the present invention.

Because the electric contacts of the DUT for transmitting high frequency signal are usually provided in the area near the periphery of the DUT, the second spring probes 40 and the above-described electrically conductive film 71 or flexible circuit board 80 for transmitting high frequency signal are also usually disposed in the area near the periphery of the probe seat 20. Although it may still need first spring probes 30 to be disposed around the second spring probes 40, the shape of the electrically conductive film 71 or flexible circuit board 80 can be designed according to the arrangement of the first and second spring probes 30 and 40. For example, in FIG. 13 the area of the bottom surface 222 of the middle die 22 covered by the flexible circuit board 80 avoids the area having the middle through holes 223 for the first spring probes 30 to penetrate therethrough. Of course, the area of the bottom surface 222 of the middle die 22 covered by the flexible circuit board 80 may include one or more middle through holes 223. In such case, the flexible circuit board 80 is provided with through holes corresponding in position to the middle through holes 223 for the first spring probes 30 to penetrate therethrough. Alternatively, the electrically conductive film 71 or flexible circuit board 80 may be partially located correspondingly to the medium or low frequency signal contacts of the DUT. As shown in FIGS. 14-15, a fifth preferred embodiment of the present invention takes the case with the flexible circuit board 80 as an instance. The flexible circuit board 80 is provided therein with not only the above-described high speed traces 83A and 83B, but also a general trace 84 for transmitting ground signal, power signal or general medium or low frequency signal. Besides, the flexible circuit board 80 is provided on the bottom surface 81 thereof with an electric contact 82C connected with an end of the general trace 84. The electric contact 82C is abutted by another second spring probe 40C. This means the second spring probes shown in FIG. 14 include two high frequency probes 40A and 40B electrically connected with the high speed traces 83A and 83B, and a medium or low frequency probe 40C electrically connected with the general trace 84. In other words, the electric contact 82C corresponds in position to a medium or low frequency signal contact of the DUT. It can be known that although the short and thick second spring probes 40 and 40A-C are applicable to high frequency testing, but also applicable to medium or low frequency testing in the condition that the second spring probes 40 and 40A-C can be electrically connected with the testing machine through the electrically conductive layer 70 or 80. Therefore, according to the arrangement of the high frequency signal contacts and medium or low frequency signal contacts of the DUT, some of the medium or low frequency signal contacts may be probed by the second spring probes for the convenience of the arrangement of the electrically conductive film 71 or flexible circuit board 80. Besides, if the medium or low frequency probe 40C is a ground probe for transmitting ground signal, it provides shielding effect to the high frequency probes 40A and 40B and thereby enhances their electrical properties.

Figure 16:
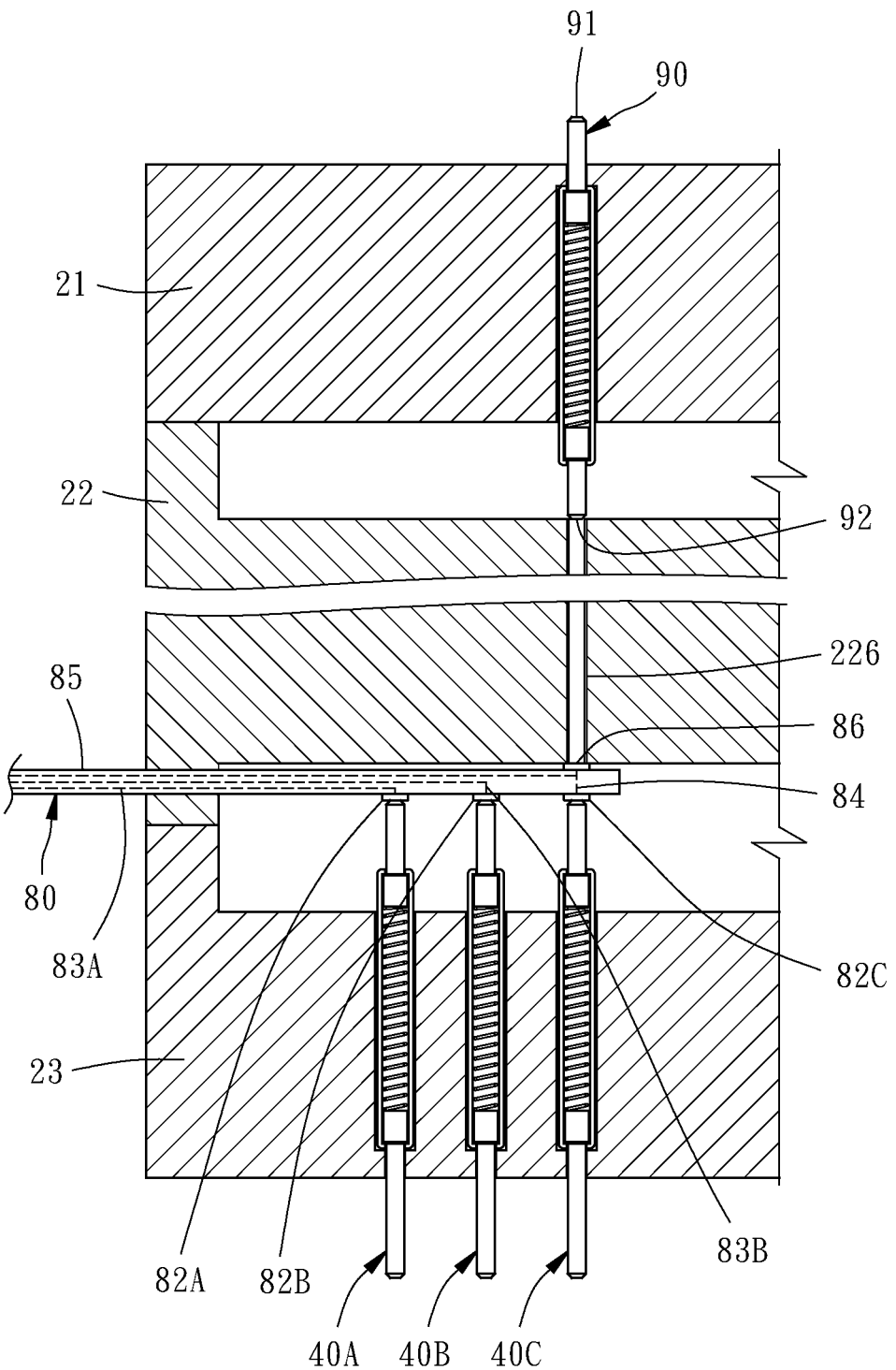
FIG. 16 is a schematic sectional view of a part of a probe head for high frequency signal test and medium or low frequency signal test at the same time according to a sixth preferred embodiment of the present invention.

Referring to FIG. 16, a probe head for high frequency signal test and medium or low frequency signal test at the same time according to a sixth preferred embodiment of the present invention is similar to the above-described probe head in the fifth preferred embodiment, and the medium or low frequency probe 40C is a ground probe. However, the flexible circuit board 80 in this embodiment is provided on the top surface 85 thereof with an electric contact 86 electrically connected with the general trace 84 and the electric contact 82C, and the middle die 22 has a conductive via 226 electrically connected with the electric contact 86. This means the conductive via 226 is plated on two ends and inner surface thereof with a metallic layer. The bottom end of the conductive via 226 contacts the electric contact 86, thereby electrically connected with the ground probe 40C through the general trace 84. Besides, the probe head in this embodiment further includes a third spring probe 90 penetrating through the upper die 21. The third spring probe 90 in this embodiment is a traditional spring probe same as the second spring probes 40 and 40A-C, but the type of the third spring probe 90 is unlimited. The third spring probe 90 is shorter than the first spring probe 30. The top end 91 of the third spring probe 90 is adapted to be electrically connected with the above-described main circuit board or space transformer of the probe card. The bottom end 92 of the third spring probe 90 is located inside the probe seat 20 and abutted against the top end of the conductive via 226. Therefore, the third spring probe 90 is electrically connected with the ground probe 40C through the conductive via 226 and the general trace 84 of the flexible circuit board 80. Such arrangement makes the flexible circuit board 80 and the main circuit board of the probe card have identical ground potential and brings relatively higher flexibility in probe arrangement.

Figure 17:
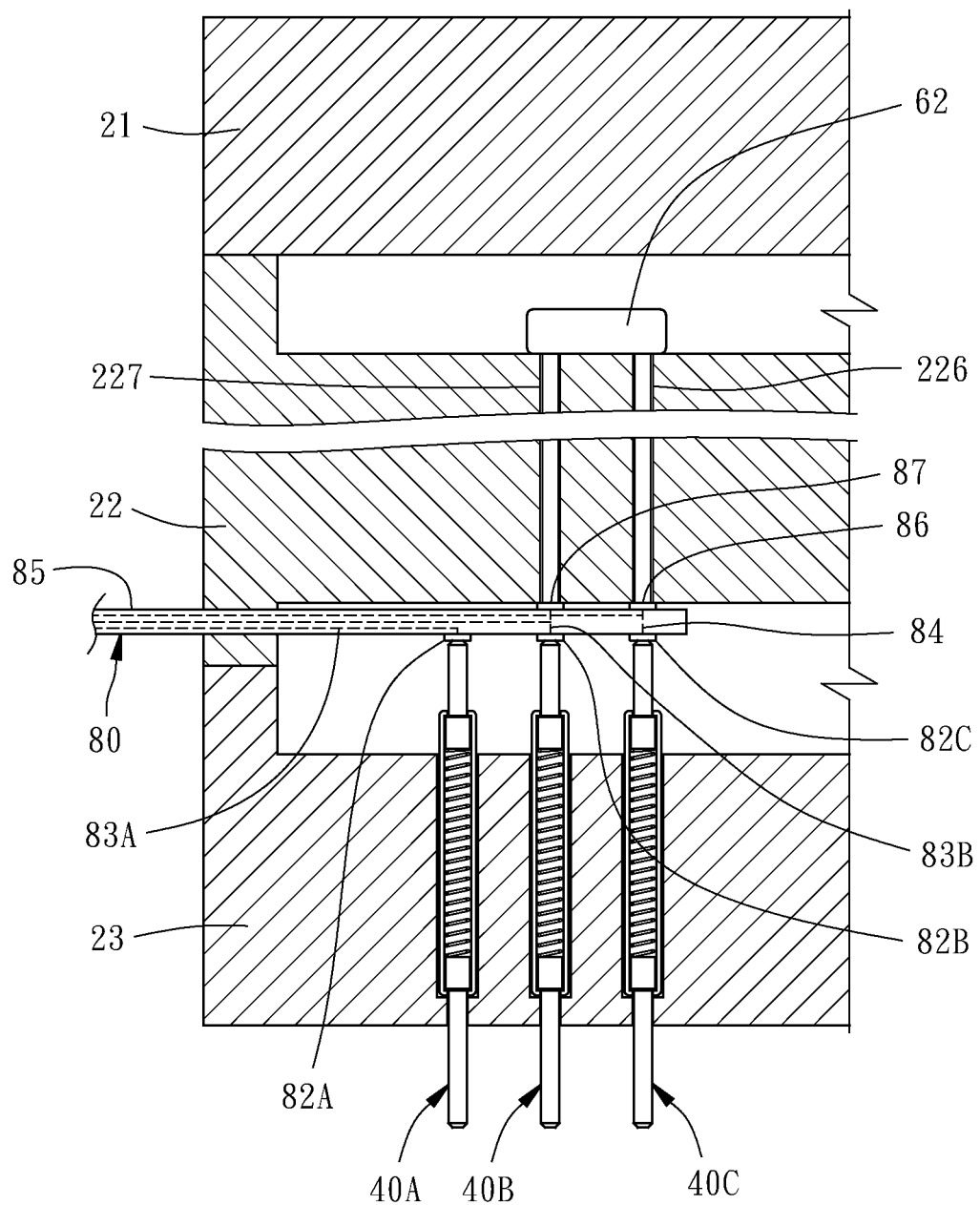
FIG. 17 is a schematic sectional view of a part of a probe head for high frequency signal test and medium or low frequency signal test at the same time according to a seventh preferred embodiment of the present invention.

Referring to FIG. 17, a probe head for high frequency signal test and medium or low frequency signal test at the same time according to a seventh preferred embodiment of the present invention is similar to the above-described probe head in the fifth preferred embodiment. However, the flexible circuit board 80 in this embodiment is provided on the top surface 85 thereof with an electric contact 86 electrically connected with the general trace 84 and the electric contact 82C, and an electric contact 87 electrically connected with the high speed trace 83B and the electric contact 82B. Besides, the middle die 22 has a conductive via 226 electrically connected with the electric contact 86, and a conductive via 227 electrically connected with the electric contact 87. The bottom ends of the two conductive vias 226 and 227 contact the electric contacts 86 and 87 respectively, thereby electrically connected with the general trace 84 and the high speed trace 83B respectively, so as to be electrically connected with the medium or low frequency probe 40C and the high frequency probe 40B, respectively. Besides, the probe head in this embodiment further includes an electronic component 62 electrically connected to the top ends of the two conductive vias 226 and 227. The electronic component 62 may be a capacitance, an inductance, a resistance or a combination of at least two of them. Such manner of disposing the electronic component 62 is suitable especially for the condition that the electronic component is to be disposed very close to the probe. Secondly, the aforementioned electronic component 62 is unlimited to be located right above the medium or low frequency probe 40C and the high frequency probe 40B. Further speaking, the electronic component 62 can be disposed at any position by using the internal wiring or surface wiring of the middle die 22 to be electrically connected with the electronic component 62, thereby increasing the flexibility of the arrangement of the electronic component. In addition, the electronic component 62 in the afore-described embodiment is electrically connected between the medium or low frequency probe 40C and the high frequency probe 40B, but the electronic component 62 is unlimited thereto. For example, the electronic component 62 may be electrically connected between a high/medium or low frequency signal probe and a ground probe, i.e. between a high/medium or low frequency signal trace and a ground trace of the probe head, between a high/medium or low frequency signal probe and another high/medium or low frequency signal probe, or between a power probe and a ground probe.

Figure 19:
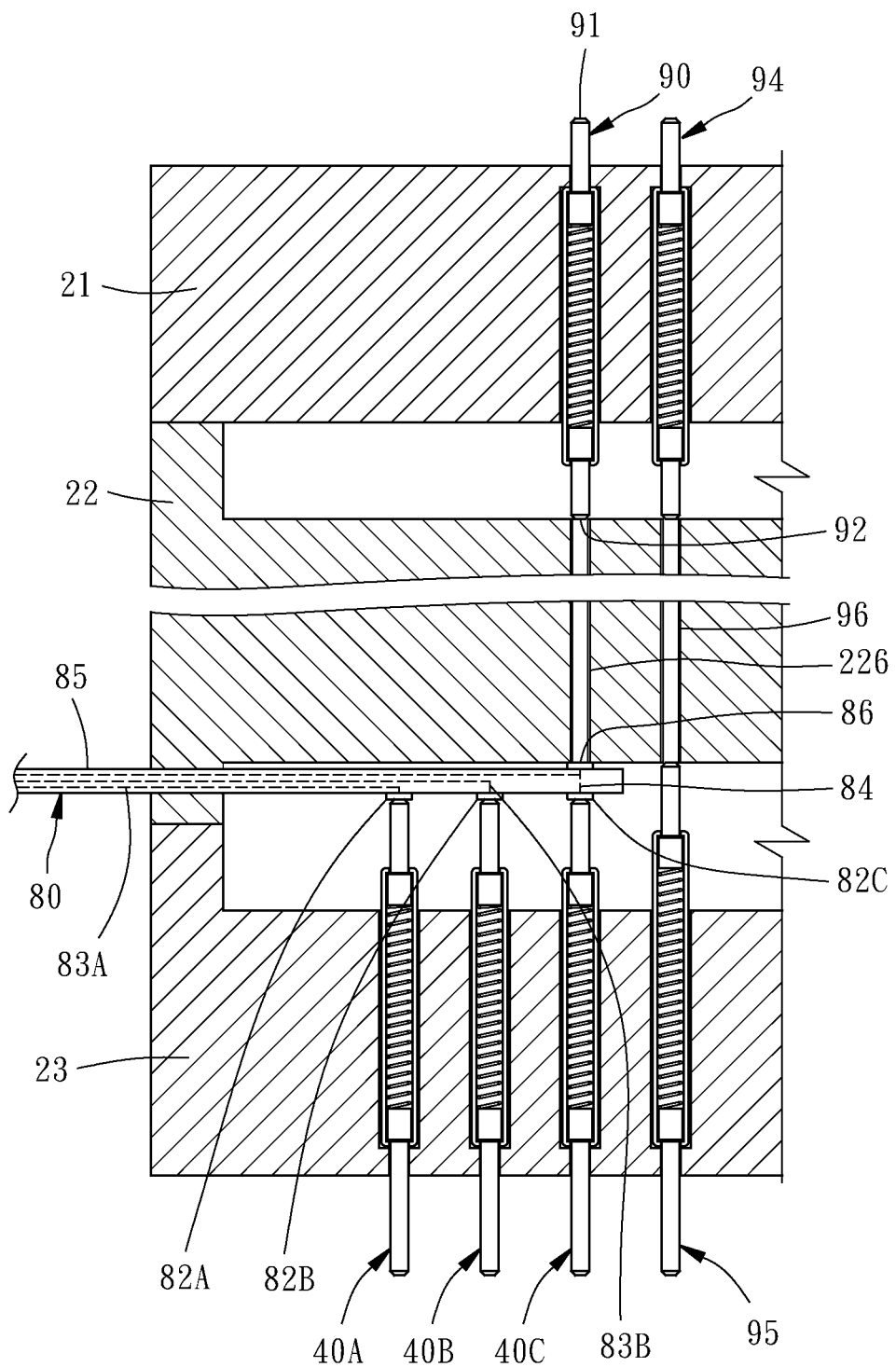
FIG. 19 is a schematic sectional view of a part of a probe head for high frequency signal test and medium or low frequency signal test at the same time according to an eighth preferred embodiment of the present invention.

Referring to FIG. 19, a probe head for high frequency signal test and medium or low frequency signal test at the same time according to an eighth preferred embodiment of the present invention is similar to the above-described probe head in the sixth preferred embodiment, but this embodiment further includes a structure functioned similarly to the first spring probe 30 and formed by two relatively shorter spring probes and the circuit inside the middle die. Specifically speaking, the probe head 10 in this embodiment further includes a fourth spring probe 94 penetrating through the upper die 21, and a fifth spring probe 95 penetrating through the lower die 23. The fourth and fifth spring probes 94 and 95 are configured as being the same with the above-described first to third spring probes 30, 40 and 90. The length of the fourth and fifth spring probes 94 and 95 is approximately equal to the length of the second and third spring probes 30 and 40, thereby much shorter than the first spring probe 30. The fourth and fifth spring probes 94 and 95 are electrically connected with each other through a connecting circuit 96 inside the middle die 22. In this embodiment, the connecting circuit 96 is a conductive via plated on the inner surface and two ends thereof with an electrically conductive layer, like the above-described conductive via 226. The fourth and fifth spring probes 94 and 95 are electrically connected with each other in a way that the bottom end of the fourth spring probe 94 and the top end of the fifth spring probes 95 are abutted against the top and bottom ends of the conductive via 96, respectively. Such structure composed of the fourth and fifth spring probes 94 and 95 and the connecting circuit 96 inside the middle die 22 is also adapted to transmit medium or low frequency signal or ground signal. This structure is also applicable to other embodiments of the present invention.

It should be noted that in the case that the die, e.g. middle die, is a multi-layer die provided therein with electrically conductive lines, the electrically conductive layer may be composed of the wiring and conductive holes (e.g. conductive via, blind hole and/or buried hole) inside the die and/or contact pads (electric contacts) to attain the above-described functions of the electrically conductive layer 70 or 80 in the embodiments shown in FIGS. 11-17. Secondly, in each above embodiment, the lower die 23 may be configured with or without the recess 241 at the places where the second spring probes 40 and 40A-C are installed.

As described above, the probe head provided in first to second preferred embodiments can perform medium or low frequency test and high frequency signal loopback test at the same time, and the probe head provided in third to eighth preferred embodiments can perform medium or low frequency test and high frequency non-loopback test at the same time. Therefore, in the precondition of preventing the probe card from too complicated circuit design, the present invention is functional in high frequency signal test and medium or low frequency signal test at the same time, meets the requirements of fine pitch and high frequency testing at the same time, and satisfies different high frequency testing requirements.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe head for transmitting a first test signal and a second test signal higher in frequency than the first test signal, the probe head comprising:
   a probe seat comprising an upper die, a middle die and a lower die, each of the upper die, the middle die and the lower die having a top surface and a bottom surface, which face toward opposite directions, the middle die being disposed between the bottom surface of the upper die and the top surface of the lower die;
   an electrically conductive layer disposed on one of the upper die, the middle die and the lower die and located inside the probe seat;
   a first spring probe penetrating through the upper die, the middle die and the lower die for transmitting the first test signal; and
   at least two second spring probes penetrating through the lower die for transmitting the second test signal, each of the second spring probes being shorter than the first spring probe and having a top end located inside the probe seat, two said second spring probes being electrically connected with each other in a way that the top ends of the two said second spring probes are abutted against the electrically conductive layer;
   wherein the lower die has at least one lower installation hole unit penetrating through the top surface and the bottom surface of the lower die; the lower installation hole unit comprises at least two lower installation holes and a communicating space communicating with said at least two lower installation holes; each of the lower installation holes accommodates one of said second spring probes; each of the second spring probes is partially located in the communicating space of the lower installation hole unit.

2. The probe head as claimed in claim 1, wherein the electrically conductive layer is disposed on one of the bottom surface of the upper die, the top surface of the lower die, the top surface of the middle die, and the bottom surface of the middle die.

3. The probe head as claimed in claim 1, wherein one of the upper die, the middle die and the lower die is provided with a recess, in which the electrically conductive layer is located.

4. The probe head as claimed in claim 1, wherein the electrically conductive layer comprises at least one conducting area comprising two abutted sections, and a connecting section connecting the two abutted sections; each of the abutted sections is abutted by the top end of one of said second spring probes.

5. The probe head as claimed in claim 4, wherein the electrically conductive layer comprises two said conducting areas, the abutted sections of which are abutted by the top ends of the second spring probes arranged as a differential probe set for differential signaling.

6. The probe head as claimed in claim 4, wherein the electrically conductive layer is made of metal by one of electroplating and chemical plating; one of the bottom surface of the upper die and the bottom surface of the middle die is provided with the connecting section and a plurality of recesses, in which the abutted sections are located respectively.

7. The probe head as claimed in claim 1, wherein the lower die has two said lower installation hole units; each of the lower installation hole units accommodates two said second spring probes arranged as a differential probe pair for differential signaling.

8. The probe head as claimed in claim 1, wherein the lower die comprises a lower plate and an upper plate piled on a top surface of the lower plate; each of the second spring probes penetrates through the upper plate and the lower plate.

9. The probe head as claimed in claim 1, wherein the lower installation hole unit comprises a recess recessed from the top surface of the lower die to provide the communicating space; the lower installation holes of the lower installation hole unit penetrate through a bottom surface of the recess and the bottom surface of the lower die.

10. The probe head as claimed in claim 9, wherein the lower die comprises a lower plate and an upper plate piled on a top surface of the lower plate; the lower installation holes penetrate through the top surface and a bottom surface of the lower plate; the upper plate has an upper through hole; the upper through hole and the top surface of the lower plate collectively form the recess of the lower installation hole unit; the recess has a non-circle cross-section, a length of a shortest side of which is larger than a sum of a pitch between the second spring probes located in the same recess and a largest diameter of the lower installation hole.

11. The probe head as claimed in claim 1, wherein each of the lower installation holes comprises a larger radius portion and a smaller radius portion extending from the larger radius portion to the bottom surface of the lower die.

12. The probe head as claimed in claim 1, wherein one of the upper die, the middle die and the lower die is different in material from the others.

13. The probe head as claimed in claim 1, further comprising a positioning film disposed inside the probe seat; each of the first and second spring probes is inserted through a positioning hole of the positioning film.

14. The probe head as claimed in claim 1, wherein the electrically conductive layer comprises at least one electrically conductive film.

15. The probe head as claimed in claim 1, wherein each of the lower installation holes comprises an upper section and a lower section; the communicating space is located between the upper section and the lower section of each of the lower installation holes; the upper section extends downwardly from the top surface of the lower die to the communicating space; the lower section extends upwardly from the bottom surface of the lower die to the communicating space.

16. The probe head as claimed in claim 15, wherein the lower die comprises a lower plate, a middle plate and an upper plate piled in order; the upper section and the lower section of each of the lower installation holes penetrate through the upper plate and the lower plate respectively; the middle plate has a middle through hole, in which the communicating space is provided; the middle through hole has a non-circle cross-section, a length of a shortest side of which is larger than a sum of a pitch between the second spring probes located in the same middle through hole and a largest diameter of the lower installation hole.

17. The probe head as claimed in claim 1, further comprising two other spring probes penetrating through the upper die and the lower die respectively and electrically connected with each other through a connecting circuit located inside the middle die.

* * * * *